(12) United States Patent
Henningson et al.

(10) Patent No.: US 6,771,073 B2
(45) Date of Patent: Aug. 3, 2004

(54) MICROPROCESSOR-BASED HAND-HELD ELECTRICAL-TESTING SYSTEM AND METHOD

(75) Inventors: Dale B. Henningson, Manti, UT (US); Bruce A. Purkey, Rogers, AR (US)

(73) Assignee: Auto Meter Products, Inc., Sycamore, IL (US)

( * ) Notice: Subject to any disclaimer, the term of this patent is extended or adjusted under 35 U.S.C. 154(b) by 0 days.

(21) Appl. No.: 10/336,575

(22) Filed: Jan. 3, 2003

(65) Prior Publication Data

US 2003/0128036 A1 Jul. 10, 2003

Related U.S. Application Data

(60) Provisional application No. 60/345,044, filed on Jan. 4, 2002.

(51) Int. Cl.[7] ............................................. G01N 27/416
(52) U.S. Cl. ...................................................... 324/426
(58) Field of Search ................................ 324/426, 427, 324/429, 430; 320/118, 123, 134, 136, DIG. 21, DIG. 18; D10/77, 78; 340/635, 636

(56) References Cited

U.S. PATENT DOCUMENTS

| | | | | |
|---|---|---|---|---|
| 5,159,272 A | * | 10/1992 | Rao et al. | 324/429 |
| 5,254,952 A | | 10/1993 | Salley et al. | 324/429 |
| 5,426,371 A | | 6/1995 | Salley et al. | 324/429 |
| 5,572,136 A | | 11/1996 | Champlin | 324/426 |
| 5,635,841 A | | 6/1997 | Taylor | 324/380 |
| 5,757,192 A | | 5/1998 | McShane et al. | 324/427 |
| 5,767,661 A | | 6/1998 | Williams | 320/152 |
| 5,821,756 A | | 10/1998 | McShane et al. | 324/430 |
| 5,831,435 A | | 11/1998 | Troy | 324/426 |
| 5,914,605 A | | 6/1999 | Bertness | 324/430 |
| 5,945,829 A | | 8/1999 | Bertness | 324/430 |
| 6,037,778 A | | 3/2000 | Makhija | 324/433 |
| 6,051,976 A | | 4/2000 | Bertness | 324/426 |
| 6,061,638 A | | 5/2000 | Joyce | 702/63 |
| 6,091,245 A | | 7/2000 | Bertness | 324/426 |
| 6,172,505 B1 | * | 1/2001 | Bertness | 324/430 |
| D442,503 S | * | 5/2001 | Lundbeck et al. | D10/77 |
| 6,359,442 B1 | * | 3/2002 | Henningson et al. | 324/426 |

FOREIGN PATENT DOCUMENTS

WO    WO 99/56121 A1    11/1999    ......... G01N/27/46

OTHER PUBLICATIONS

Product Literature for Micro 200/205 of Midtronics, Inc. USA, dated Nov. 25, 2000. 2 pages.
Product Literature for Monitron MCT–148 of Midtronics, Inc. USA, dated Nov. 25, 2000, 6 pages.
Product Literature for Midtron 3200 of Midtronics, Inc. USA, dated Nov. 25, 2000, 2 pages.
Product Literature for Celltron Plus of Midtronics, Inc. USA, dated Nov. 25, 2000, 2 pages.
Product Literature for Micro Celltron of Midtronics, Inc. USA, dated Nov. 25, 2000, 3 pages.

* cited by examiner

Primary Examiner—Pia Tibbits
(74) Attorney, Agent, or Firm—Jenkens & Gilchrist

(57) ABSTRACT

The present invention provides methods and systems for testing voltage drops in positive and negative legs of an electrical system and for determining maximal current capacity of the electrical system based on the measured voltage drops. This is accomplished by connecting load leads of a testing unit at a starter or alternator of the electrical system, and connecting voltage leads of the testing unit at a battery of the electrical system. A load of known resistance is applied and a voltage at the load is measured. Voltage drops at the positive and negative legs of the electrical system are determined, based at least in part on the voltage at the load. A maximum current capacity of the electrical system is calculated based on the determined voltage drops.

30 Claims, 23 Drawing Sheets

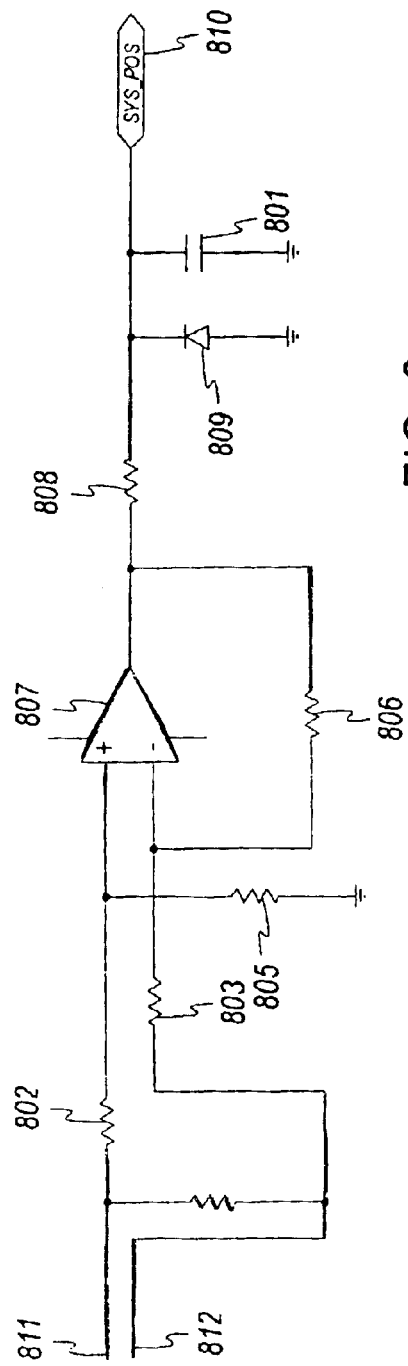
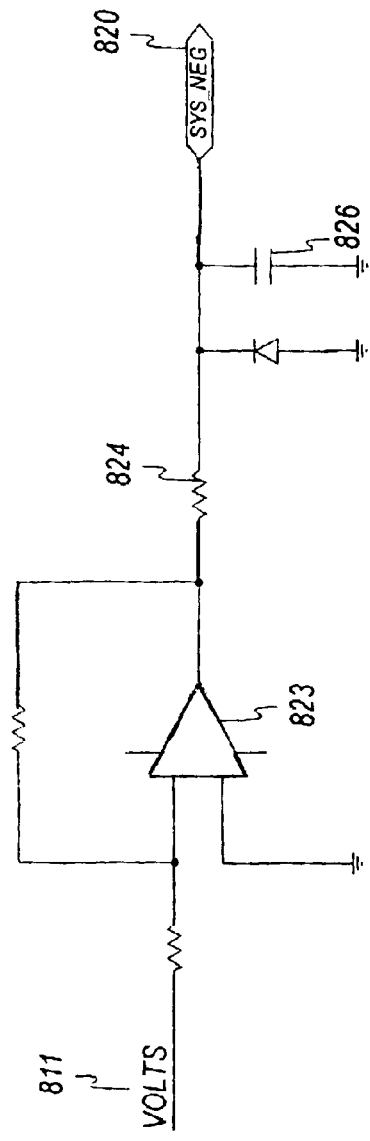
FIG. 3a
FIG. 3b

MICROPROCESSOR-BASED HAND-HELD ELECTRICAL-TESTING SYSTEM AND METHOD

CROSS-REFERENCE TO RELATED APPLICATIONS

This application relates to U.S. Provisional Patent Application No. 60/345,044 filed Jan. 4, 2002, entitled "Microprocessor-Based Hand-Held Electrical-Testing System and Method," which is related to U.S. patent application Ser. No. 09/590,350, entitled "A Microprocessor-Based Hand-Held Battery Tester System," and filed on Jun. 8, 2000.

FIELD OF THE INVENTION

The present invention relates generally to methods of and systems for testing voltage drops and current-carrying capacities of components of an electrical system, and more particularly to testing methods and systems that measure voltage drops in charging and starting components of the electrical system and compute the current carrying capacity and/or evaluate the condition of the components based thereon.

HISTORY OF RELATED ART

In an electrical system, loads and power sources are typically interconnected via wires, cables, bus bars, or other conductors. These conductors and the means of making connections therebetween may become loose, corroded, or damaged. It is therefore advantageous to test the conductors and the connections therebetween in electrical systems, especially those carrying large currents.

One example of such a system is an electrical system of an automobile or truck. Charging and starting portions of these electrical systems utilize very high currents, which are often as great as many hundreds of amps. Components of these electrical systems are frequently subjected to very harsh environments that include, for example, heat, moisture, large temperature changes, battery acid, and vibration. If the components become loose, corroded, or damaged, or are inadequate in size, their resistance will be too high for transmission of sufficient power from a source to a load of the electrical system. Higher resistances impede adequate current from flowing through the electrical system and create a voltage drop across the defective cables or bad connections, thereby reducing power to the load. In the charging portion of the electrical system high resistances can prevent necessary power from getting to a battery from the alternator. In the starting portion of the electrical system, adequate power may not be supplied to a starter from the battery.

A typical ohmmeter cannot be used to measure the resistance of cables and connections because the resistance in these components is typically very low (e.g., milliohms). To properly test the cables and the connections, voltage drops must be measured in the presence of a flowing current and calculations made based thereon using Ohm's Law. In systems where the current varies, such as, for example, a charging portion, or in systems where the current is intermittent, such as, for example, a starting portion, steps must be taken to ensure that the voltage drop is measured during peak current flow. Voltage drop measurements under conditions of intermittent current have traditionally been tested by using a variable load tester having an auxiliary voltmeter. The variable load tester has typically been connected at the starter (or alternator) and auxiliary volt leads of the tester connected at the battery.

In such a procedure an operator applies and adjusts the current using the variable load tester. While current flows, the operator notes the voltage at the starter (or alternator), and also notes the voltage at the battery. The operator then subtracts one voltage from the other to obtain the voltage drop of the electrical system. If the voltage drop exceeds a specified amount (typically 0.5 volts), the electrical system is deemed problematic and the operator determines if the problem is in a positive leg or in a negative leg of the electrical system.

This determination is typically made by reconnecting the auxiliary volt leads to measure a voltage drop across the positive leg. The operator then applies and adjusts the load and notes the voltage across the positive leg. The voltage drop can not exceed one half of a maximal acceptable amount (i.e. 0.25 volts). A value exceeding one half of the maximal acceptable amount indicates a possible defect in the positive leg. To measure the voltage drop across a negative leg of the system, the auxiliary volt leads are moved to the negative leg. A load is applied and adjusted and the voltage drop across the negative leg is measured. A value exceeding one half of the maximal acceptable amount (i.e. 0.25 volts) indicates a possible defect in the negative leg.

Other variations of the aforementioned procedure, in which voltage drops are tested in an electrical system, have been attempted. For example, an inductive amp probe can be used to measure the current in the system and a variable load tester can be added to supplement the system load if needed. The operator is thereby allowed to connect the variable load tester at the battery; however, the operator is still required to perform multiple procedures and keep track of and subtract a series of voltages from one another. In addition, such approaches to testing voltage drops in an electrical system require the operator to perform multiple setups to completely test the positive and negative legs of the system.

Because voltage drop tests are so difficult to perform and require a significant amount of knowledge and skill by the operator, they are rarely performed. Often the battery, starter, or alternator is unnecessarily replaced, resulting in operations that fail to solve the underlying problem.

SUMMARY OF THE INVENTION

The present invention addresses these and other drawbacks by automatically determining current-carrying capacities and voltage drops in both positive and negative legs of an electrical system, after a setup procedure. In accordance with embodiments of the present invention, load leads of a testing device are connected at a starter (or alternator) in an electrical system of, for example, an automotive vehicle, while voltage leads of the testing device are connected at a battery of the electrical system. The testing device then applies a load of known resistance and measures a voltage at the load. Voltage drops in cables of the system are calculated by measuring a difference in voltage of two positive leads (a positive leg of the system) and two negative leads (a negative leg of the system). From the voltage across the load of known resistance, a current drawn by the testing device of the present invention is calculated from Ohm's law. This current, along with the voltage drops in the positive and negative legs, is used to calculate a resistance in the two legs. The current that would produce a maximum allowable drop in the system and the percentage of the voltage drop in the positive and negative legs may then be calculated and displayed. The maximum current or the voltage drops can be compared to acceptable values and a "pass" or "fail" result can be given to the user.

In accordance with one embodiment of the present invention, a method of measuring voltage drops in an electrical system is described, in which a plurality of load leads are connected to, for example, a charging component or a starting component, of the electrical system. The plurality of load leads includes a positive load lead and a negative load lead, each coupled to a testing device. Additionally, a plurality of voltage leads are connected to a battery or system of the electrical system. The plurality of voltage leads also includes a positive voltage lead and a negative voltage lead, each of which are coupled to the testing device. A load of known resistance is applied to the electrical system by the testing device and a voltage is measured at the load. Then, a first voltage drop is measured between the positive load lead and the positive voltage lead and a second voltage drop is measured between the negative load lead and the negative voltage lead, wherein measurements of the first and second voltage drops are based, at least in part, on the voltage at the load.

In accordance with another embodiment of the present invention, a method of testing a magnetic switch circuit, which is coupled to a starter component in an electrical system, is described. The method begins with a step of first disconnecting the magnetic switch circuit from an "S" terminal of the starter component. A first positive lead of a plurality of load leads is connected to the "S" terminal. The plurality of load leads is also coupled to a testing device. A first negative lead of the plurality of load leads is connected to ground. At a second terminal of the starter component, a second positive lead of a plurality of voltage leads is connected. The plurality of voltage leads is also coupled to the testing device. A second negative lead from the plurality of voltage leads is connected to ground. The magnetic switch circuit is then energized and a first voltage drop, between the first positive lead and the first negative lead, and a second voltage drop, between the second positive lead and the second negative lead, is calculated. An indication of results obtained is provided, wherein the indication is based, at least in part, on the first and second voltage drops.

In accordance with yet another embodiment of the present invention, an apparatus for testing and measuring voltage drops in a positive and a negative leg of an electrical system is provided. The apparatus includes a plurality of load leads adapted to connect to a charging or starting component of the electrical system, wherein the plurality of load leads includes a positive load lead and a negative load lead, a plurality of voltage leads adapted to connect to a battery or system of the electrical system, wherein the plurality of voltage leads includes a positive voltage lead and a negative voltage lead; a means for applying a load of known resistance to the electrical system; a means for measuring a voltage at the load; and a means for measuring a first voltage drop between the positive load lead and the positive voltage lead, and a second voltage drop between the negative load lead and the negative voltage lead, wherein measurements of the first and second voltage drops are based, at least in part, on the voltage at the load.

In accordance with yet another embodiment of the present invention, an apparatus for testing a magnetic switch circuit coupled to a starter component, in an electrical system, is provided. The apparatus includes a means for disconnecting the magnetic switch circuit from an "S" terminal of the starter component; a first positive lead of a plurality of load leads adapted to connect to the "S" terminal, wherein the plurality of load leads is coupled to the tester; a first negative lead of the plurality of load leads adapted to connect to ground; a second positive lead from a plurality of voltage leads adapted to connect to a second terminal of the starter component, wherein the plurality of voltage leads is coupled to the tester, a second negative lead from the plurality of voltage leads adapted to connect to ground; a means for energizing the magnetic switch circuit; a means for calculating a first voltage drop between the first positive lead and the first negative lead and calculating a second voltage drop between the second positive lead and the second negative lead; and a first indicator, for providing a first indication of results obtained, wherein the first indication is based, at least in part, on the first and second voltage drops.

BRIEF DESCRIPTION OF THE DRAWINGS

A more complete understanding of the methods and systems of the present invention may be obtained by reference to the following Detailed Description when taken in conjunction with the accompanying Drawings, wherein:

FIG. 3a is a schematic diagram of a circuit illustrating how a SYS_POS output results from a measurement of a voltage across the load leads depicted in FIG. 1;

FIG. 3b is a schematic diagram of a circuit illustrating how a SYS_NEG output results from a determination that the load leads depicted in FIG. 1, are connected in reverse;

FIG. 11b is a flow chart of a magnetic-switch-circuit-portions subroutine accessed by the subroutine of FIG. 11a;

DETAILED DESCRIPTION OF PREFERRED EMBODIMENTS

The present invention will now be described more fully with reference to the accompanying drawings, in which preferred embodiments of the present invention are shown. The present invention may, however, be embodied in many different forms and should not be construed as limited to the embodiments set forth herein. An illustrative embodiment of a hand-held testing unit is described below as it might be used to provide improved methods of and systems for determining current-carrying capacities and voltage drops in positive and negative legs of an electrical system.

Figure 1:
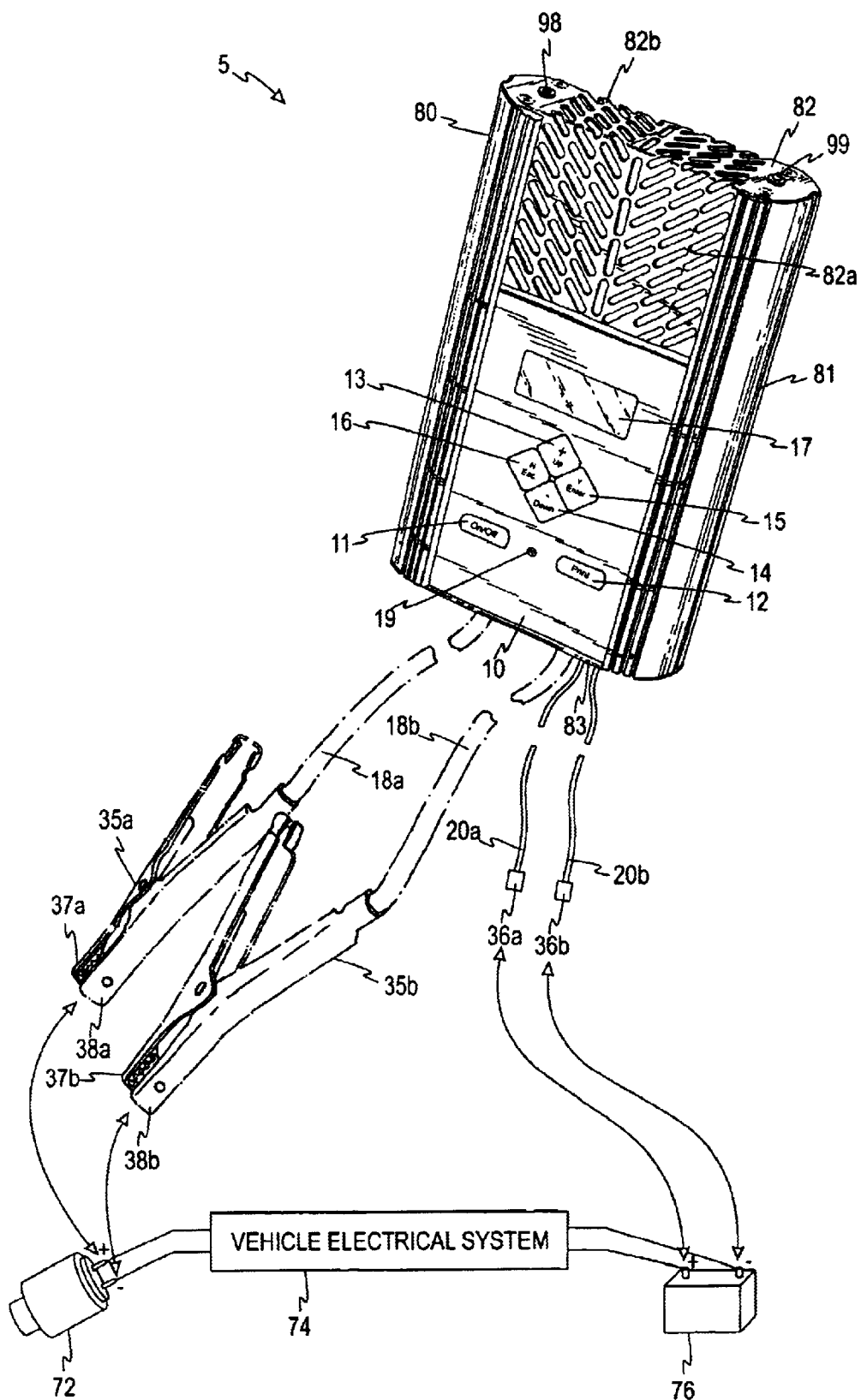
FIG. 1 is a perspective view of a voltage drop testing unit embodying principles of embodiments of the present invention.

Referring first to FIG. 1, there is shown a perspective view of a hand-held testing unit 5 embodying principles of embodiments of the present invention. A bottom front panel 10 includes an on/off key 11, a print key 12, and a key pad with four manual keys 13–16 used in conjunction with a liquid crystal display (LCD) 17. The four manual keys 13–16 include an up key 13, a down key 14, an enter key 15, and an escape key 16. The four manual keys 13–16 provide input signals to a microprocessor (not shown) that controls operation of the testing unit 5, including messages and/or data displayed on the LCD 17. A pair of load leads 18a and 18b, with kelvin clamps 35a and 35b, extend from an end of the testing unit 5 for connection to a starter or an alternator 72 of an electrical system 74 under test.

Each kelvin clamp 35a, 35b comprises a first jaw 37a, 37b and a second jaw 38a, 38b, for facilitating connection to the electrical system under test. Furthermore, the pair of load leads 18a and 18b includes a positive load lead 18a and a negative load lead 18b. Each load lead of the pair of load leads 18a and 18b also comprises a large conductor (not shown) that carries current when a load is applied and a small conductor (not shown) that is used to measure voltage. The large and small conductors are associated with the first and second jaws, 37a, 37b and 38a, 38b, respectively, of the kelvin clamps 35a and 35b. Additionally, a pair of voltage leads 20a and 20b with clamps 36a and 36b, respectively, extend from the testing unit 5 for connection to a battery 76 of the electrical system 74 under test. The pair of voltage leads comprise a positive voltage lead 20a and a negative voltage lead 20b. The remaining components of the testing unit 5 will be described below in conjunction with FIGS. 15–19.

Figure 2:
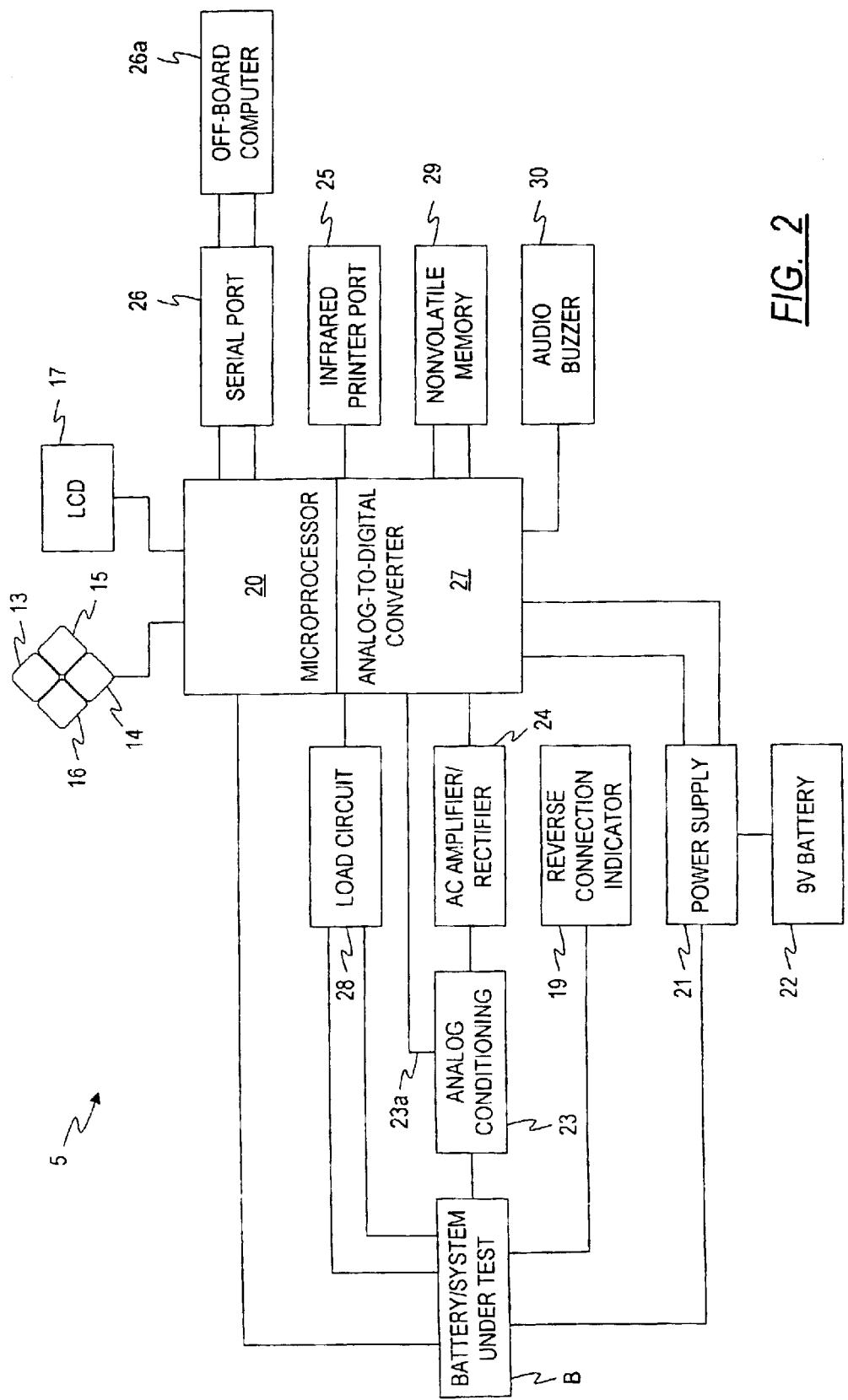
FIG. 2 is a block diagram of the testing unit shown in FIG. 1.

Referring now to FIG. 2, a block diagram of the testing unit 5 is shown. The testing unit 5 is controlled by a microprocessor 20 that receives power from a power supply circuit 21, which in turn is powered by a lead-acid battery/system B under test. A 9-volt battery 22 provides an alternative power source when the testing unit 5 is not connected to the battery B. The microprocessor 20, which also includes an Analog/Digital (A/D) converter 27, receives input signals from the four manual keys 13–16, an analog conditioning circuit 23, and an alternating current (AC) amplifier/rectifier circuit 24, as will be described in more detail below.

Still referring to FIG. 2, the microprocessor 20 provides output signals to a liquid crystal display (LCD) 17 for communicating with a user, to an infrared printer port for printing results, to a serial port 26 for communicating with an off-board computer 26a, such as, for example, a personal computer, to a load circuit 28 that can be connected to the battery/system B under test, and to an audio buzzer 30 for providing audible alarms or signals. The microprocessor 20 is also connected to a nonvolatile memory 29 for storing and retrieving data that is to be preserved in the event of a loss of power.

Referring now to FIG. 3a, there is shown a schematic diagram of a circuit illustrating how an output voltage (SYS_POS) 810 results from measurement of a voltage across the load leads 18a and 18b depicted in FIG. 1. The circuit is arranged in a differential amplifier configuration, such that a voltage difference between VOLTS+ 811 and VOLTS– 812 (wherein VOLTS+ 811 and VOLTS– 812 indicate the voltage at the positive and negative load leads 18a and 18b, respectively), preferably with an input range of 0–15.36 Volts, produces again of less than one. Two 187 KΩ resistors 802 and 803, and two 49.9 KΩ resistors 805 and 806 are therefore arranged with an operational amplifier 807 in the differential amplifier configuration to set the gain of the operational amplifier 807. A 2 KΩ resistor 808 is coupled with a 1 microfarad capacitor 801 to form a low-pass filter in order to reduce system noise. A diode 809 is included in the circuit to detect a reverse connection of VOLTS+ 811 and VOLTS– 812 and also to prevent transmission of a voltage below 0.3 Volts to the A/D converter 27 of the microprocessor 20. The SYS_POS output voltage 810 is input into the microprocessor 20.

Referring now to FIG. 3b, there is shown a schematic diagram of a circuit illustrating how a positive output voltage (SYS_NEG) 820 results from a determination that the load leads 18a and 18b of FIG. 1 have been connected in reverse. An inverting amplifier 823 reads a voltage from VOLTS+ 811 and converts the voltage of VOLTS+ 811 to a positive signal ranging from 0 to 4.096 Volts. This positive signal is filtered by a low pass filter comprising a 2 KΩ resistor 824 and a 1 microfarad capacitor 826. The SYS_NEG output voltage 820 is then sent to the A/D converter 27 (not shown) and an indication of a reversed connection of the load leads 18a and 18b is displayed on the LCD 17. Thus, the circuit of FIG. 3b uses an inverting amplifier 823 to send a positive voltage to the A/D converter 27 if the load leads 18a and 18b are connected in reverse.

Figure 3C:
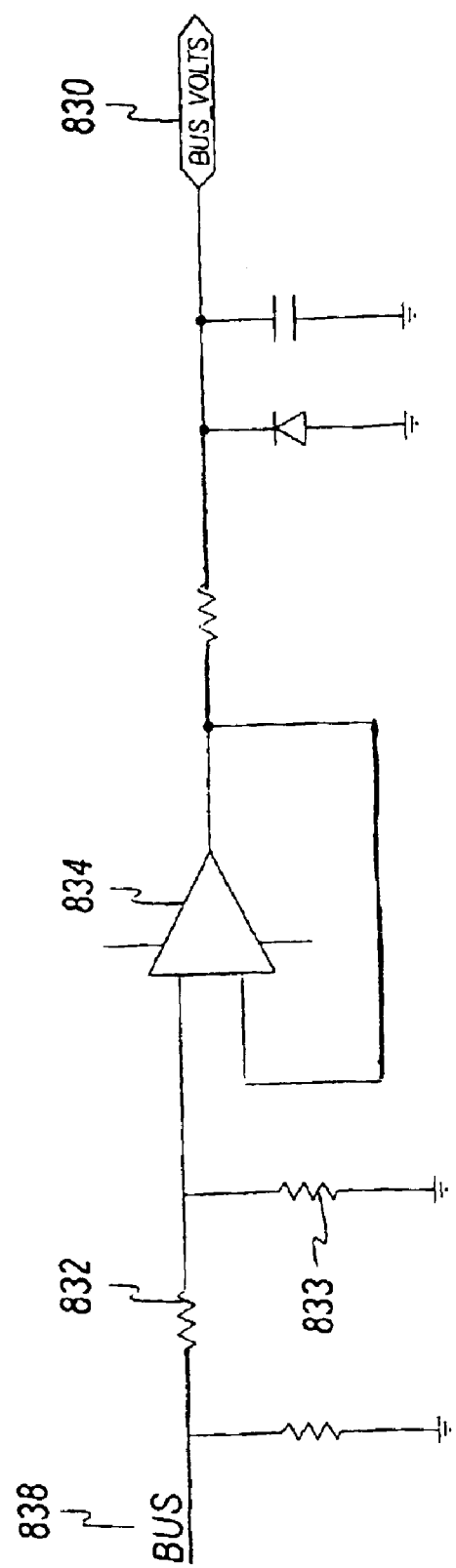
FIG. 3c is a schematic diagram of a circuit illustrating how a BUS_VOLTS output results from a measurement of a voltage across large conductors of the load leads depicted in FIG. 1.

Referring now to FIG. 3c, there is shown a schematic diagram of a circuit illustrating a measurement of a voltage across the large conductors of the load leads 18a and 18b resulting in an output voltage (BUS_VOLTS) 830 indicative of a measured voltage across the large conductors. An operational amplifier 834 is arranged in a voltage-follower configuration and a pair of resistors 832 and 833 are arranged to create a voltage divider circuit. The voltage divider/voltage follower combination measures a voltage (BUS+ 838) across the large conductors of the load leads 18a and 18b.

The microprocessor 20 of FIG. 2 compares the BUS_VOLTS output voltage 830 to the SYS_POS output voltage 810 of FIG. 3a, in order to ensure that a proper connection has been made at the load leads 18a and 18b. A difference between the SYS_POS output voltage 810 and the BUS_VOLTS output voltage 830 that is greater than a value pre-programmed in the microprocessor 20 indicates a poor connection of the kelvin clamps 35a, 35b of FIG. 1.

Figure 3D:
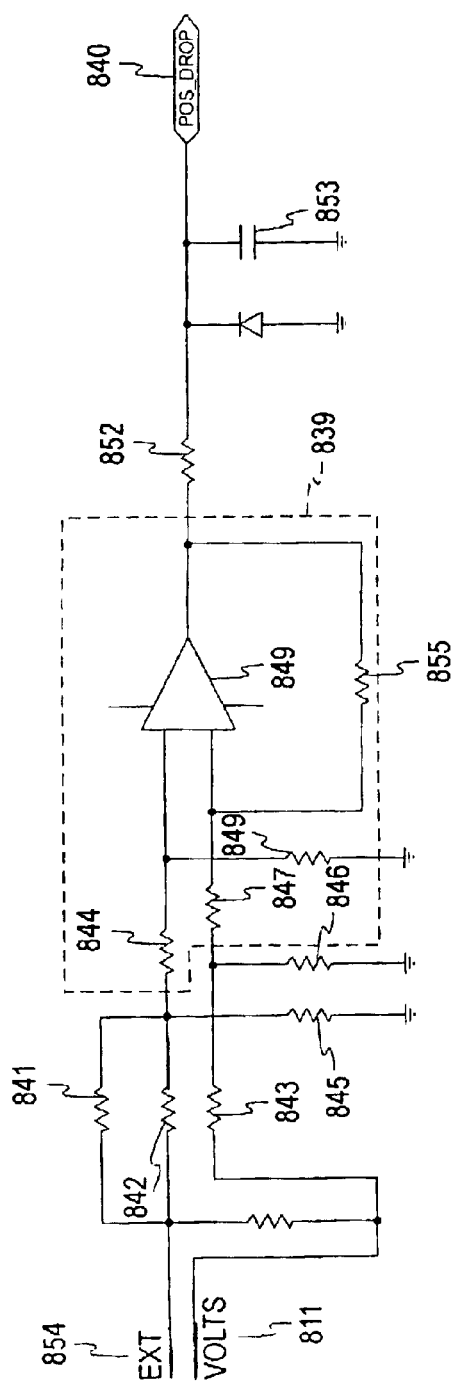
FIG. 3d is a schematic diagram of a circuit illustrating how a POS_DROP output results from a measurement of a voltage drop across a positive leg of an electrical system.

Referring now to FIG. 3d, there is shown a schematic diagram of a circuit illustrating how a positive leg output voltage (POS_DROP) 840 results from a measurement of a voltage drop across a positive leg of the electrical system. Two voltage dividers, each preferably comprising a 4.22 KΩ resistor and a 649Ω resistor (842/845 and 843/846, respectively) divide input signals EXT+ 854 (a voltage at the positive voltage lead 20a of voltage leads 20a and 20b) and VOLTS+ 811 to an operational amplifier 849, such that input signal EXT+ 854 and input signal VOLTS+ 811 are maintained within a common-mode range of the operational amplifier 849.

The input signals EXT+ 854 and VOLTS+ 811 are then sent through a differential amplifier circuit 839, which comprises two 332 KΩ resistors 844 and 847, two 4.99 MΩ resistors 848 and 855, and the operational amplifier 849. The differential amplifier circuit 839 measures a difference between EXT+ 854 (i.e., a voltage at the positive voltage lead 20a) and VOLTS+ 811 (i.e., a voltage at the positive load lead 18a). Thus, the input signals EXT+ 854 and VOLTS+ 811 are first divided, and then amplified.

A 412 KΩ resistor 841 is incorporated into the circuit to ensure a positive offset by the operational amplifier 849 so that the offset can be calibrated out in software. A signal output by the differential amplifier circuit 839 is then passed through a low-pass filter comprising a 2 KΩ resistor 852 and a 1 microfarad capacitor 853 and the resulting POS_DROP output voltage is transmitted for analysis to the microprocessor 20.

Figure 3E:
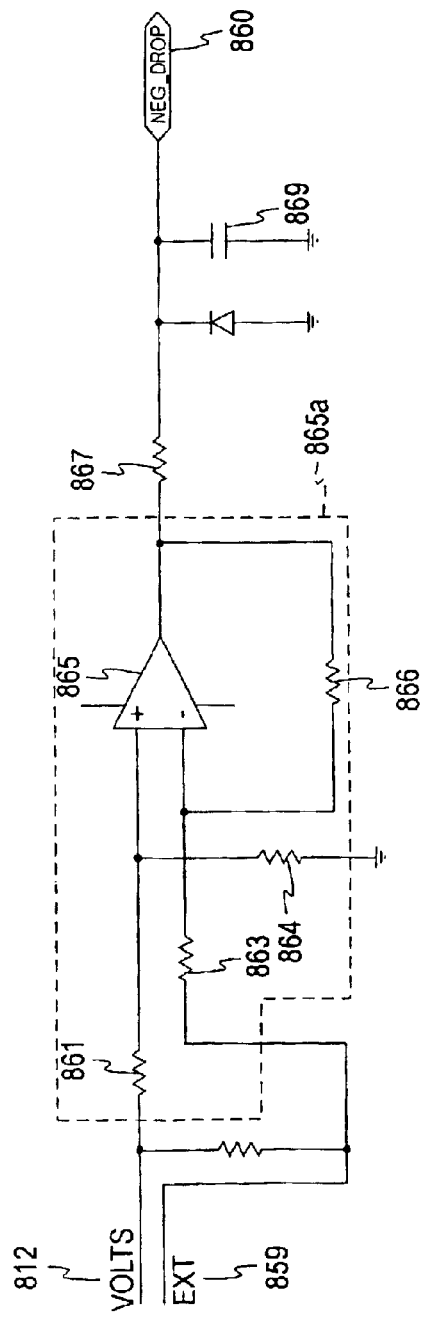
FIG. 3e is a schematic diagram of a circuit illustrating how a NEG_DROP output results from a measurement of a voltage drop across a negative leg of the electrical system.

Referring now to FIG. 3e, there is shown a schematic diagram of a circuit illustrating how a negative leg output voltage (NEG_DROP) 860 results from a measurement of a voltage drop across a negative leg of the electrical system. A difference between VOLTS− 812 (i.e., a voltage at the negative load lead 18b) and EXT− 859 (i.e., a voltage at the negative voltage lead 20b) is measured. The schematic diagram is configured similarly to that of FIG. 3d; however, unlike the schematic diagram of FIG. 3d, a voltage divider is unnecessary since both VOLTS− 812 and EXT− 859 inputs are maintained at a value close to ground. The VOLTS− 812 and EXT− 859 are transmitted through a differential amplifier circuit 865a comprising two 100 KΩ resistors 861 and 863, two 200 KΩ resistors 864 and 866, and an operational amplifier 865. A signal transmitted through the differential amplifier circuit 865a is sent through a low-pass filter, which comprises a 2 KΩ resistor 867 and a 1 microfarad capacitor 869. A NEG_DROP output voltage resulting therefrom is then sent to the microprocessor 20.

Figure 3F:
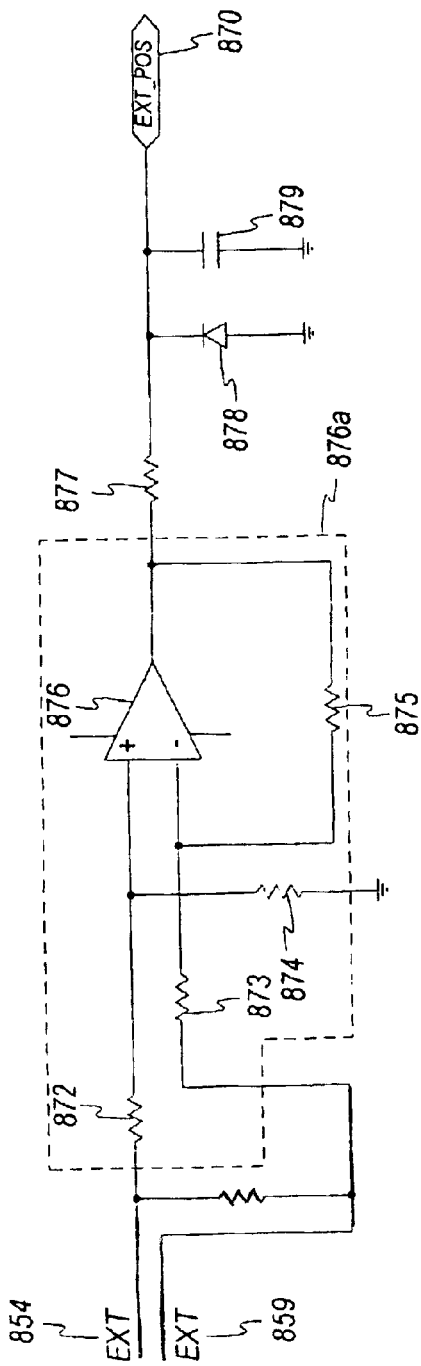
FIG. 3f is a schematic diagram of a circuit illustrating how an EXT_POS output results from a measurement of a voltage drop across the voltage leads depicted in FIG. 1.

Referring now to FIG. 3f, there is shown a schematic diagram of a circuit illustrating how a voltage lead output (EXT_POS) 870 results from a measurement of a voltage drop across the voltage leads 20a and 20b depicted in FIG. 1. In a similar fashion to the schematic diagram illustrated in FIG. 3a, the circuit of FIG. 3f incorporates a differential amplifier 876a comprising two 187 KΩ resistors 872 and 873, two 49.9 KΩ resistors 874 and 875, and an operational amplifier 876. The differential amplifier circuit 876a reads input voltages EXT+ 854 and EXT− 859, which correspond to voltages of the voltage leads 20a and 20b, respectively, and transmits an output signal. A gain of less than one is produced by the differential amplifier 876a. An output signal transmitted by the differential amplifier 876a is then sent through a low-pass filter comprising a 2 KΩ resistor 877 and a 1 microfarad capacitor 879. A diode 878 is included in the circuit to prevent transmission of a voltage of less than 0.3 Volts in the event that the inputs EXT+. 854 and EXT− 859 are connected in reverse. The EXT_POS output voltage 870 is input to the microprocessor 20.

Figure 3G:
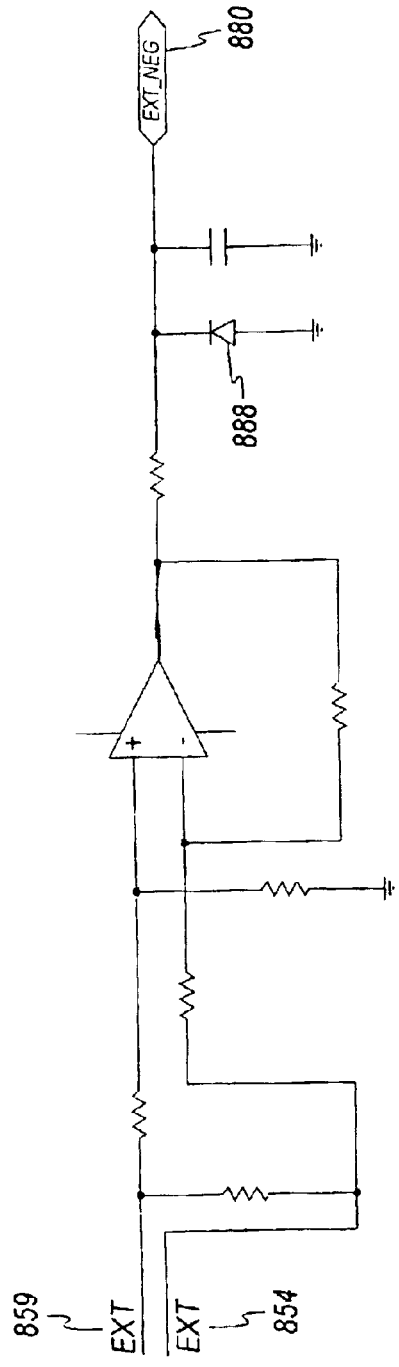
FIG. 3g is a schematic diagram of a circuit illustrating how an EXT_NEG output results from a determination that voltage leads depicted in FIG. 1 are connected in reverse.

Referring now to FIG. 3g, there is shown a schematic diagram of a circuit illustrating how a reversely-connected voltage lead output (EXT_NEG) 880 results from a determination that the voltage leads 20a and 20b of FIG. 1, have been connected in reverse. The schematic diagram of FIG. 3g is similar to the circuit illustrated in FIG. 3f, with the exception that the EXT+ 854 and EXT− 859 input voltages (i.e., the voltages of the positive and negative voltage leads 20a and 20b, respectively) are reversed. The reversal of the EXT+ 854 and the EXT− 859 inputs, in combination with a diode 888, allows for detection of a reverse hookup.

Figure 4:
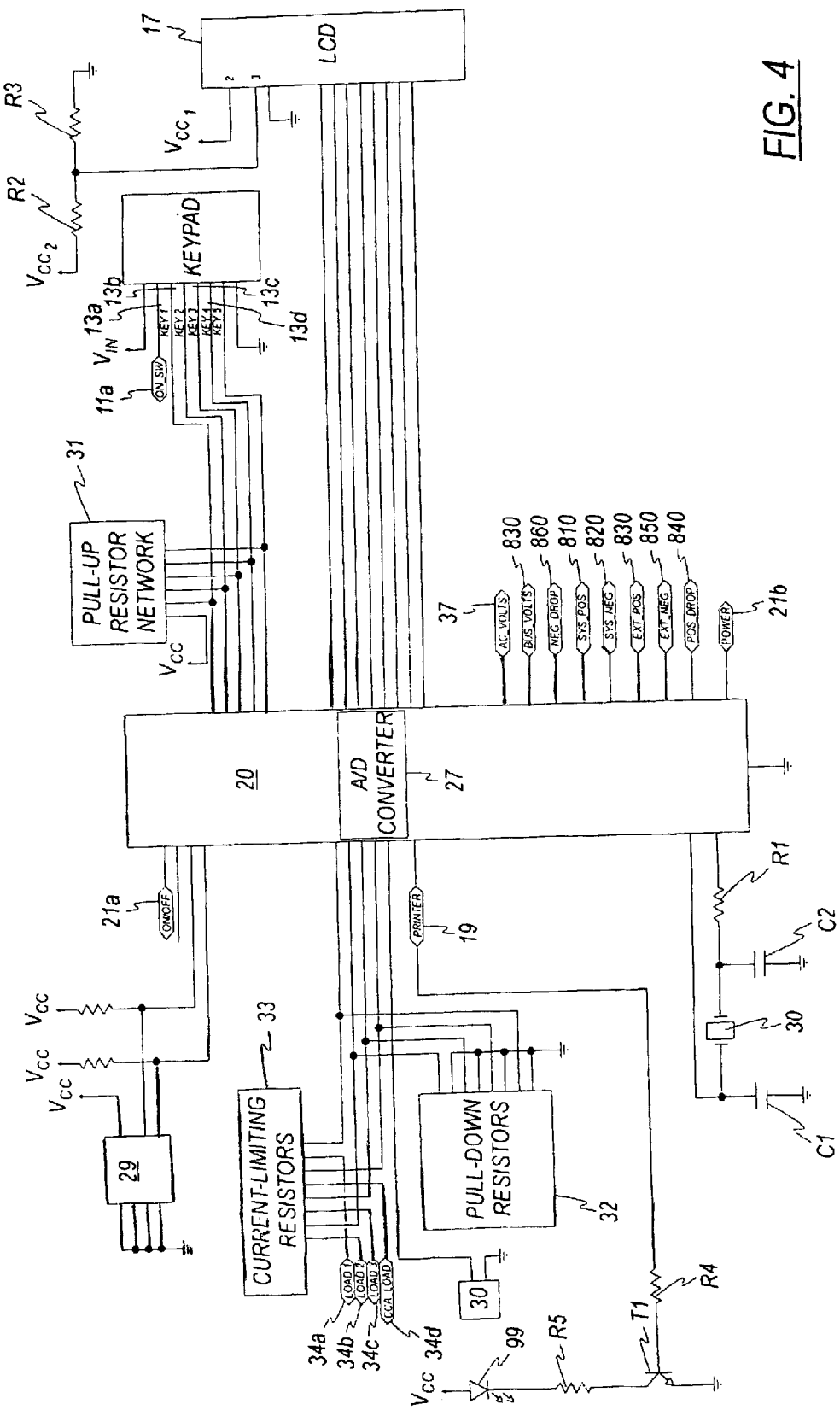
FIG. 4 is a circuit diagram of a portion of the system of FIG. 3, including a microprocessor and its display, keypad and nonvolatile memory.

Referring now to FIG. 4, there is shown a more detailed diagram of the testing unit 5 illustrated in FIG. 2. The microprocessor 20, which includes the A/D converter 27, receives an ON/OFF signal 21a from the power supply circuit 21 of FIG. 2, an ON_SW signal 11a from the on/off key 11 of FIG. 1, KEY 1–4 signals 13a–d from the four manual keys 13–16 of FIG. 1, and a signal from the print key 12 via a pull-up resistor network 31. Also received by the A/D converter 27 is an AC_VOLTS output 37 from the AC amplifier/rectifier circuit 24, the SYS_POS output voltage 810, which measures the voltage across the load leads 18a and 18b, the SYS_NEG output voltage 820, the BUS_VOLTS output voltage 830, the POS_DROP output voltage 840, the NEG_DROP output voltage 860, the EXT_POS output voltage 870, the EXT_NEG output voltage 880, and data signals from the non-volatile memory 29. Oscillator signals from an oscillator comprising a crystal 30, a pair of capacitors C1 and C2, and a current-limiting resistor R1, are also input into the A/D converter 27 of the microprocessor 20.

Still referring to FIG. 4, output signals produced by the microprocessor 20 include: display-generating signals to the LCD 17, which also receives $Vcc_1$ at terminal 2 of the LCD 17 and a reduced $Vcc_2$ at terminal 3 of the LCD 17 to set a LCD contrast (the reduction being achieved by a voltage divider formed by a pair of resistors R2 and R3 connected between $Vcc_2$ and ground, with terminal 3 of the LCD receiving a voltage that; exists between resistors R2 and R3), a POWER signal 21b for the power supply circuit 21 FIG. 2; a PRINTER signal 19 for an infrared transducer used to communicate with printers; switching signals LOAD1 34a, LOAD2 34b, LOAD3 34c, and CCA_LOAD 34d supplied via pull-down resistors 32 and current-limiting resistors 33, to control Field Effect. Transistors (FETs) that connect and disconnect various loads to the battery/system B under test; and data signals to be stored in the non-volatile memory 29.

With reference still to FIG. 4, coupling to a printer is effected by an infrared coupling diode 99 mounted in an upper end of the testing unit 5 (as also shown in FIG. 1). The PRINTER signal 19 from the microprocessor 20 is supplied via a resistor R4 to the base of a transistor T1. When the transistor T1 is turned on, current flows from a Vcc source through the diode 99, a resistor R5, and the transistor T1, to ground.

Figure 5:
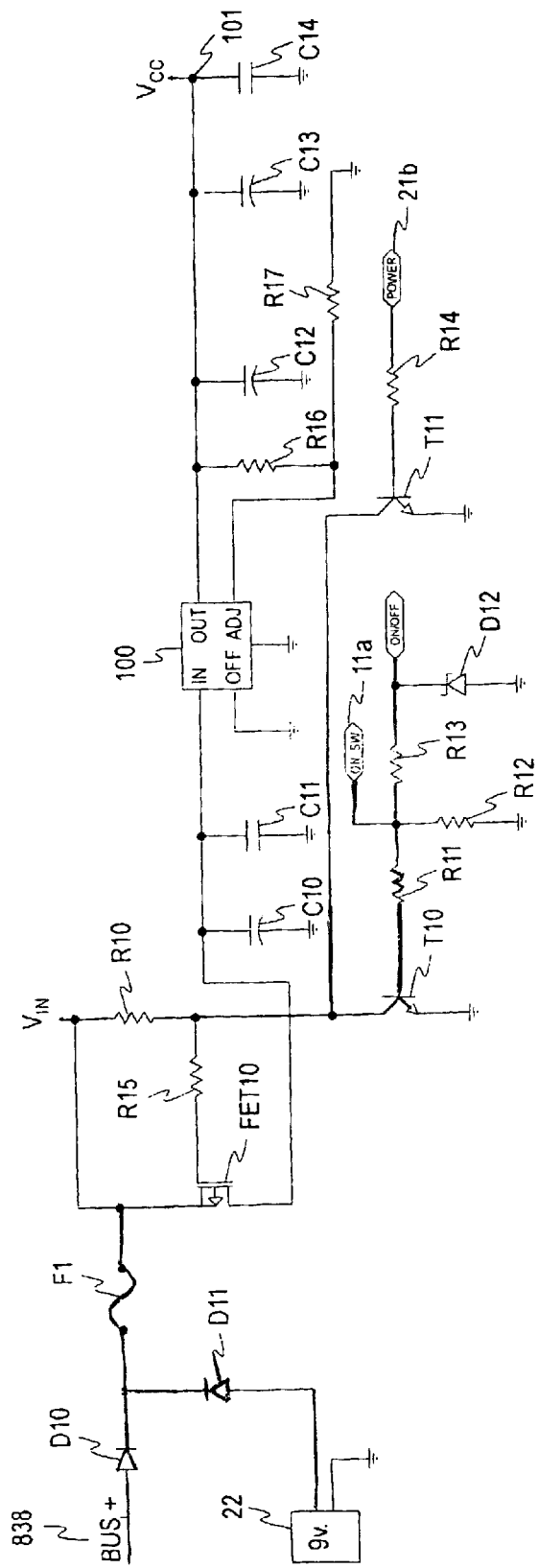
FIG. 5 is a circuit diagram of a power supply circuit used in the testing unit of FIG. 2.

Referring now to FIG. 5, there is shown a circuit diagram that illustrates in more detail the power supply circuit 21 of FIG. 2. The BUS+ input 838 to the power supply circuit is connected to battery/system B under test via the large conductor of the positive load lead 18a, while ground is connected to the large conductor of the negative load lead 18b. The supply current from the BUS+ 838 input (indicative of the voltage across the large conductors of the load leads 18a and 18b) passes through a blocking diode D10 and a resettable fuse F1 that trips under high currents, then resets after a period of time. The diode D10 prevents damage to the testing unit 5 if the load leads 18a and 18b, connected to the battery/system B under test, are reverse-connected. When the load leads 18a and 18b are not connected to the battery/system B under test, the power supply circuit 21 is powered by a 9-volt battery 22 (also shown in FIG. 2) through a blocking diode D11.

Still referring to FIG. 5, the power supply circuit 21 is turned on by the ON_SW signal 11a from the on/off key 11 (FIG. 1), and then is kept on by the POWER signal 21b (also shown in FIG. 4) output from the microprocessor 20. These signals turn on either switching transistor T10 or switching transistor T11 to draw current through a pull-up resistor R10. Specifically, the ON_SW signal 11a is applied to a base of the switching transistor T10 through a current-limiting resistor R11 and is also supplied to a pull-down resistor R12 connected to ground. An ON/OFF signal 21a (also shown in FIG. 4) to the microprocessor 20 is also supplied from the keypad through a second current-limiting resistor R13 and a voltage-limiting zener diode D12, which is connected from a terminal of the ON/OFF signal 21a to ground. The POWER signal 21b from the microprocessor 20 is supplied to the base of the switching transistor T11 through a current-limiting resistor R14.

Still referring to FIG. 5, a low voltage at a collector of either transistor T10 or T11 turns on FET 10, which then supplies current from the BUS+ input 838 to the input terminal of a voltage-regulating IC 108 to switch on the power. A gate of the FET 10 is protected by a resistor R15, and a pair of filter capacitors C10 and C11 are connected in parallel from the input of IC 108 to ground. The output of the IC 108 is connected to a terminal $Vcc_3$ which is converted to a conventional voltage converter to furnish −5 volt power throughout the unit. Three filter capacitors C12, C13 and C14 are connected in parallel from the terminal $Vcc_3$ to ground. A voltage divider is formed by a pair of resistors R16 and R17 to supply a desired voltage level to an "adjust" output of the IC 108. The voltage level Vin that exists between the resistor R10 and the fulse F1 is supplied to the four manual keys 13–16 of FIG. 1.

With continued reference to FIG. 5, the power supply circuit can be turned off by the microprocessor 20 by sending a low signal to the POWER signal 21b after the on/off key 11 has been pressed or after the testing unit 5 has been on for two minutes with no activity. When the on/off key 11 is pressed while the power supply is on, the resulting change in the ON_SW signal 11 a is sensed by the microprocessor 20, which responds by producing a low POWER signal 21b. This turns off the transistor T11, which turns off the power supply.

Figure 6:
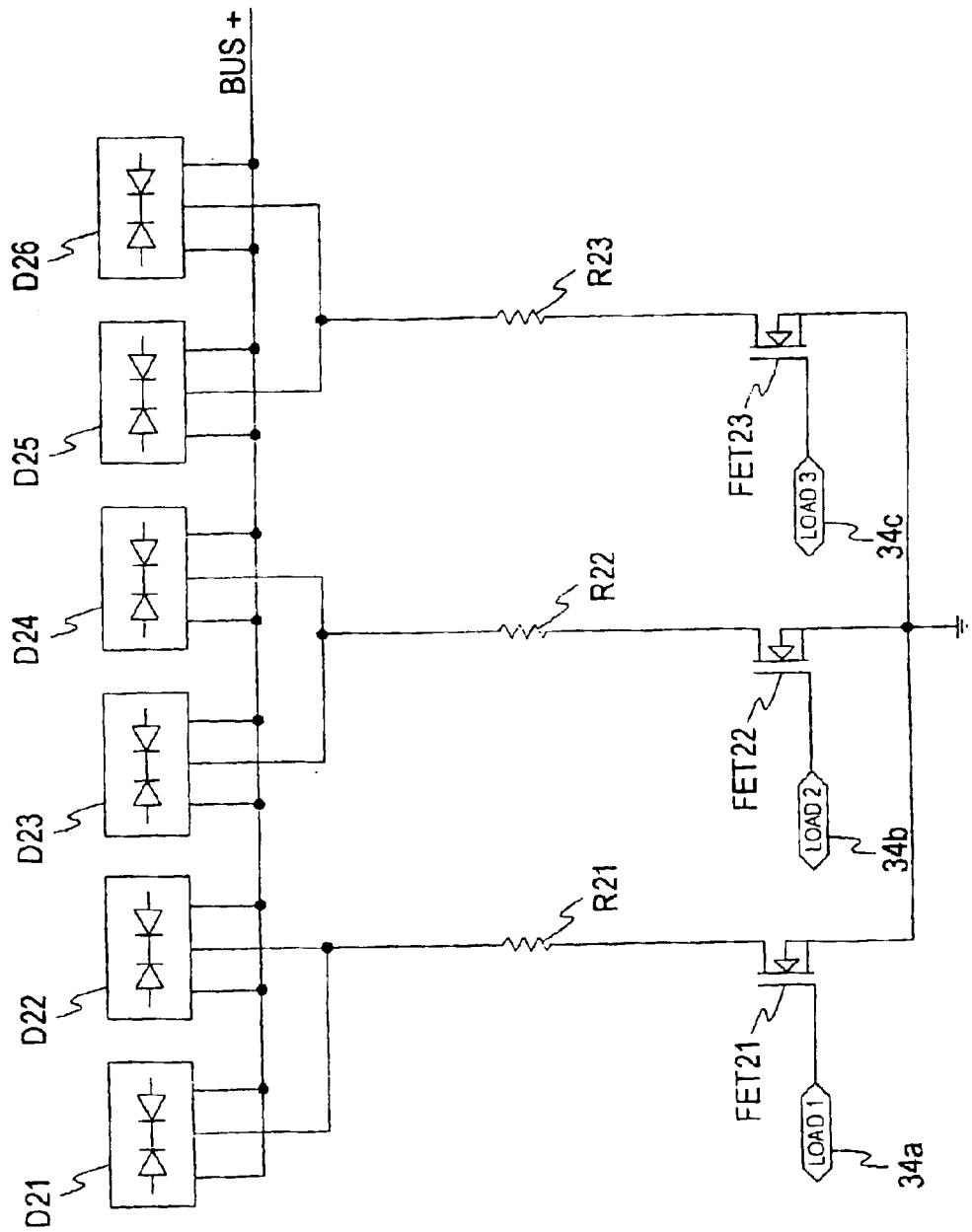
FIG. 6 is a circuit diagram of a load circuit used in the testing unit of FIG. 2.

Referring now to FIG. 6, there is shown a circuit diagram that illustrates in more detail the load circuit 28 The load circuit 28 comprises three parallel resistors R21, R22 and R23, each of which can be connected to the battery/system B under test by its own separate signal LOAD1 34a, LOAD2 34b, or LOAD3 34c which turns on a corresponding switching FET 21, 22 or 23, so that current can flow from the battery/system B under test through reverse blocking diodes D21–D26 and one or more of the resistors R21–R23 to ground. As will be described in more detail below, the load circuit 28 is connected to the battery/system B under test when it is desired to load test the battery/system B under test to evaluate its condition.

Figure 7:
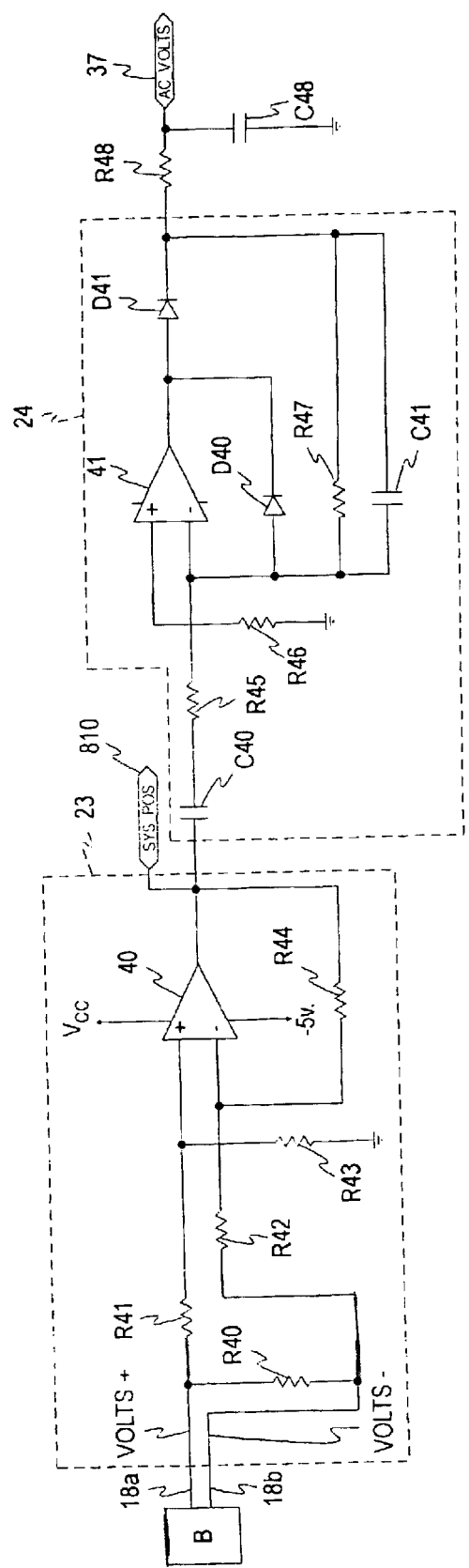
FIG. 7 is a circuit diagram of an analog conditioning and Alternating Current amplifier/rectifier circuit used in the testing unit of FIG. 2.

Referring now to FIG. 7, there is shown the analog conditioning circuit 23 and the AC amplifier/rectifier circuit 24 of FIG. 2. The analog conditioning circuit 23 is connected to terminals or posts of the battery/system B under test for measuring voltage across these posts. The connections to the battery/system B under test terminals are made with kelvin clamps 35a and 35b on the ends of the load leads 18a and 18b extending from the lower end of the testing unit 5. The VOLTS+ 811 input to the analog conditioning circuit 23 is derived from the small conductor of the positive load lead 18a, while the VOLTS− 812 input is derived from the small conductor of the negative load lead 18b. A pull-down resistor R40 is connected between the two load leads 18a and 18b.

Still referring to FIG. 7, the VOLTS+ 811 and VOLTS− 812 inputs are connected to the positive and negative inputs of an operational amplifier 40 via gain-setting resistors R41–R44 in a differential amplifier configuration. An output of the operational amplifier 40 furnishes the analog SYS_POS output voltage S10 (also shown in FIG. 3a) that represents an output voltage measuring voltage across the load leads 18a and 18b. This SYS_POS output voltage 810 is one of the inputs to the microprocessor 20 and its internal A/D converter 27.

Still referring to FIG. 7, the SYS_POS output voltage 810 of the operational amplifier 40 is also supplied through an AC coupling capacitor C40 to the AC amplifier/rectifier circuit 24 to produce a DC output representing a magnitude of any AC ripple in the battery voltage. (An AC ripple is associated with an AC component of the DC voltage derived from the battery, and typically originates from the alternator.) The capacitor C40 is connected through a gain-setting resistor R45 to the negative input of an operational amplifier 41 whose positive input is connected to a pull-down resistor R46. The output of the operational amplifier 41 is connected to a pair of rectifying diodes D40 and D41, which prevent a negative voltage from going into the microprocessor 20 and its internal A/D converter 27. An integrating capacitor C41 is connected in parallel with the two diodes D40 and D41, and a lowpass filter comprising a resistor R48 and a capacitor C48 is included to filter the signal. The resulting DC output of the AC amplifier/rectifier circuit 24 furnishes an AC_VOLTS output 37 that represents the magnitude of an AC ripple and is one of the inputs to the microprocessor 20.

Figure 8:
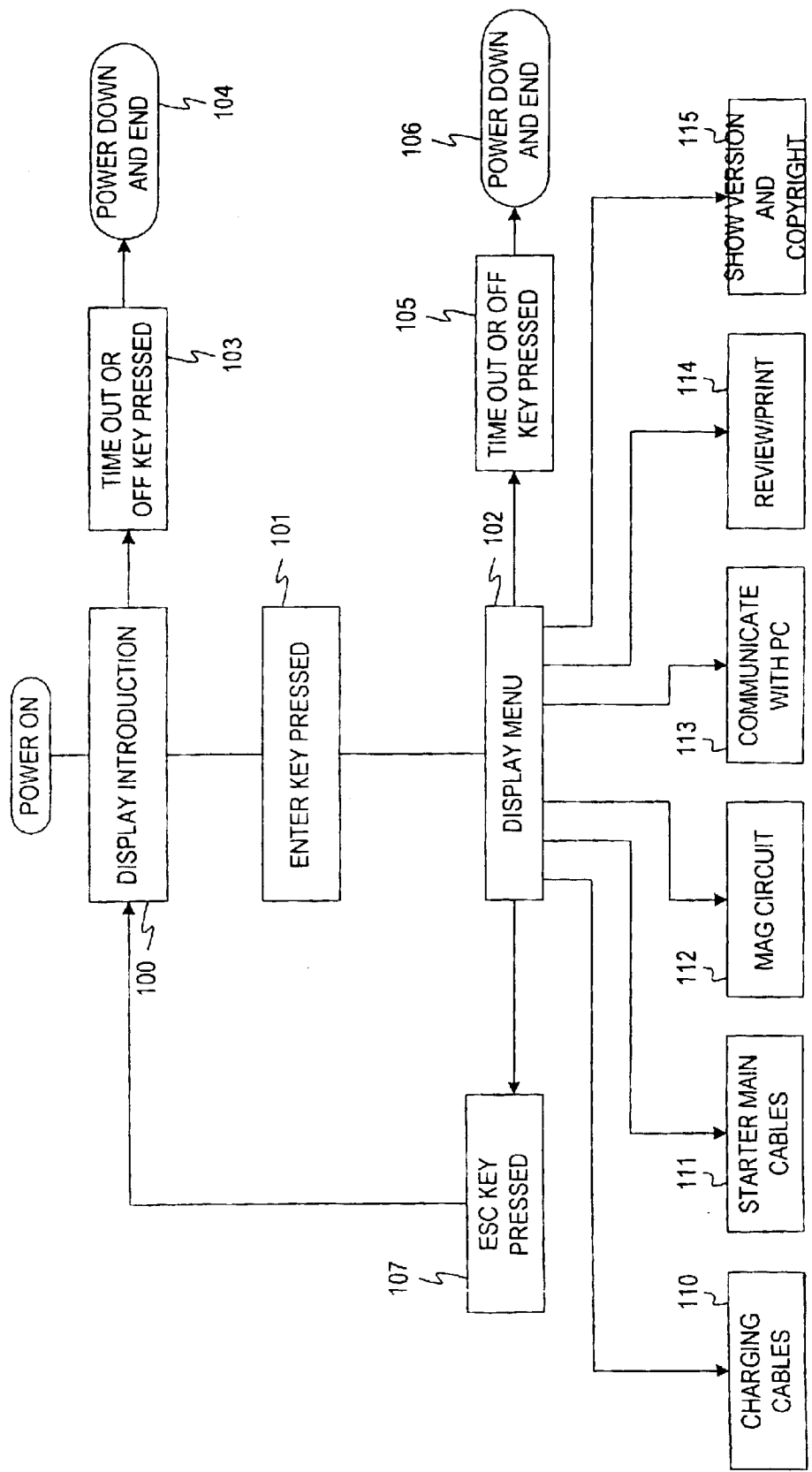
FIG. 8 is a flow chart of a main software program executed by the microprocessor to initiate operation of the testing unit of FIG. 2.

Referring now to FIG. 8, there is shown a main program executed by the microprocessor 20, and entered when the microprocessor 20 detects that the power supply has been turned on. The first step 100 of the main program displays an introductory message on the LCD 17, informing the user to select "enter" to obtain a menu of options. If, at step 103, the "enter" key is not pressed within a time-out interval measured by the microprocessor 20 or the on/off key 11 is pressed, the system powers down, as indicated at step 104. If, at step 101, the enter key 15 is pressed, the program advances to step 102, where a menu is displayed to provide the user with an array of options. The options include "charging cables", "starting main cables", "magnetic switch circuit", "communicate with PC", "review/print", and "show version and copyright", corresponding to steps 110–115, respectively.

Still referring to FIG. 8, whenever the menu is displayed at step 102, the testing unit 5 waits for the user to select one of the options by pressing the up or down key, 13 or 14, to scroll to the desired option and then pressing the enter key 15. Each selection calls one of six subroutines at one of the six steps 110–115. If, at step 105, it is detected that no option has been selected within a time-out interval measured by the microprocessor 20, or if the on/off key 11 is pressed, the subroutine is exited at step 106 and the testing unit powers down. The subroutine may also be exited at 107, by pressing the escape key 16 at any time during display of the introduction at step 100 or the options menu at step 102.

Figure 9:
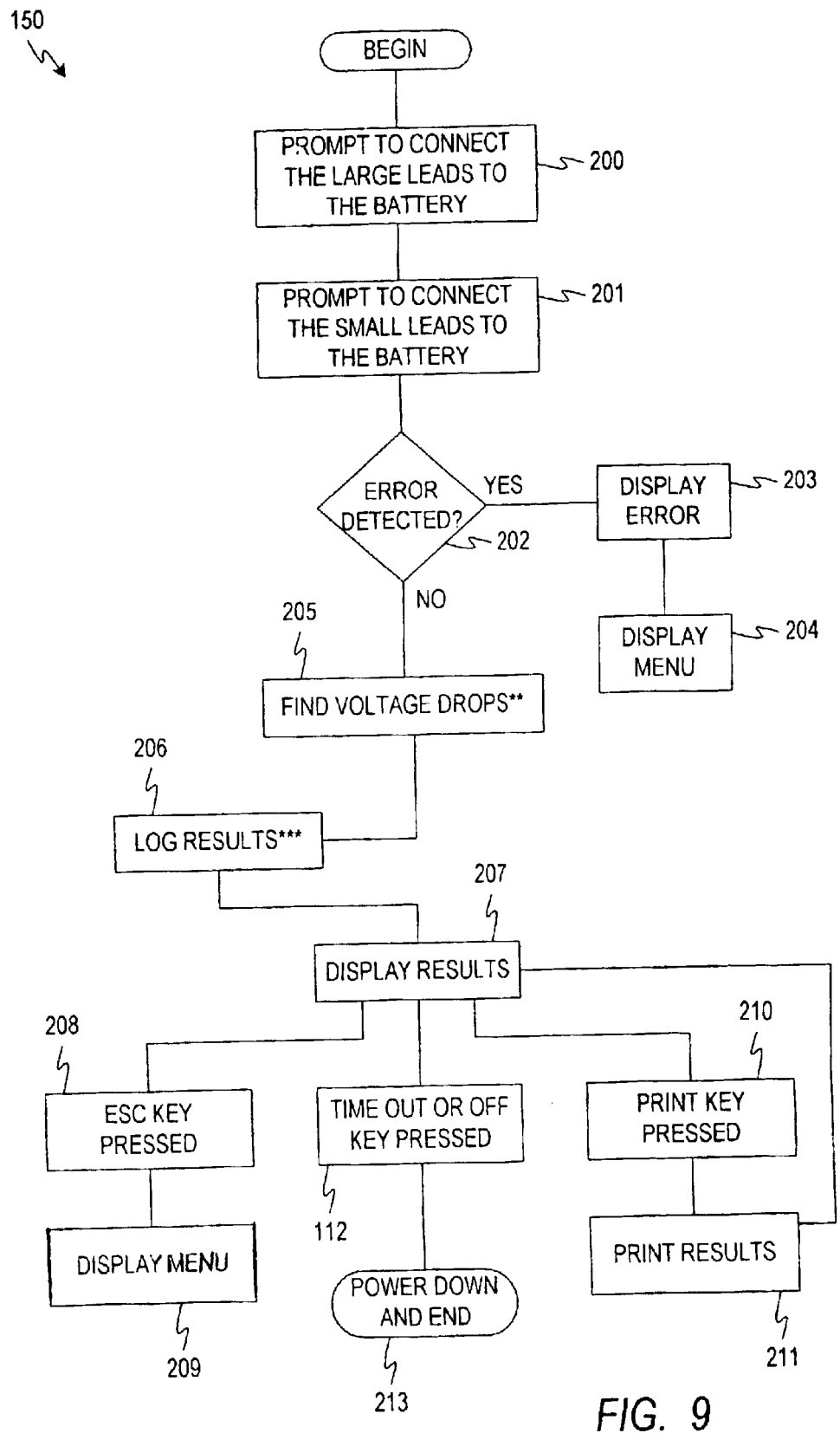
FIG. 9 is a flow chart of a charging-cables subroutine accessed by the program of FIG. 8.

Referring now to FIG. 9, there is shown a "charging cables" subroutine 150, which is called if the "charging cables" option is selected at step 110 of FIG. 8. The first step 200 of this subroutine prompts the user to connect the testing unit's load leads 18a, 18b to the alternator. At step 201, the user is prompted to connect the voltage leads 20a, 20b to the battery/system B under test. At step 202, the testing unit checks to see if any errors are detected. Possible errors include reversal of load leads 18a and 18b (indicated by a SYS_NEG output voltage exceeding 1 Volt (see FIG. 3b)), a determination that the load leads 18a and 18b were not connected (indicated by a SYS_POS output voltage less than 1 Volt (see FIG. 3a)), an improper connection of load leads 18a and 18b (indicated by a BUS VOLTS and SYS_POS output voltage difference greater than 2 Volts), reversal of voltage leads 20a and 20b (indicated by an EXT_NEG output voltage over 1 Volt), system noise (indicated by an AC_VOLTS output exceeding 4 mV), a voltage drop with no load (indicated by a POS_DROP or NEG_DROP output voltage over 0.03 Volts), and a low system battery (indicated by an EXT_POS output voltage less than 12.25).

Still referring to FIG. 9, if any such errors are detected, the subroutine of FIG. 9 advances to step 203 and the detected error(s) is displayed. At step 204, the testing unit 5 displays the main menu. If no error is detected, voltage drops are determined at step 205. Voltage drops are found by first turning on all three coils (LOAD1 34a, LOAD2 34b, AND LOAD3 34c) of the load circuit 28. The testing unit 5 typically experiences a delay of approximately 0.75 seconds as the SYS_POS, POS_DROP, and NEG_DROP output voltages are measured. From the SYS_DROP, POS_DROP, and NEG_DROP output voltage measurements, the amount of current that the wires and cables of the electrical system can handle, as well as the percent drop in the positive and negative legs of the electrical system, are computed by the following formulae:

$$MaxCurrent = \frac{Current \times AllowableDrop}{TotalDrop}$$

$$\% \, PosDrop = \frac{POS\_DROP}{TotalDrop} \times 100$$

$$\% \, NegDrop = 100 - \% \, PosDrop$$

Wherein:

$$Current = \frac{SYS\_POS}{Coil \, Resistance}$$

Total Drop = POS_DROP + NEG_DROP

Allowable Drop = 0.5 Volts (for most vehicles)

Coil Resistance = 0.1 Ohms (known resistance of coils)

At steps 206 and 207, the results are logged and displayed on the LCD 17 of the testing unit 5 as indicated at step 207.

After displaying the results at step 207, the testing unit 5 may respond to one of three conditions. If the escape key 16 is pressed (step 208), the user is returned to the menu displayed at step 102 of FIG. 8. (This is indicated by step 209.) Alternatively, if the user selects a PRINT key at step 210, at step 211, the system prints the results displayed at step 207 and then returns to step 207. If, at step 212, neither the PRINT key nor the escape key 16 are selected within a time-out interval measured by the microprocessor 20, or if the on/off key 11 is pressed, the system powers down and the subroutine is exited at step 213.

Figure 10:
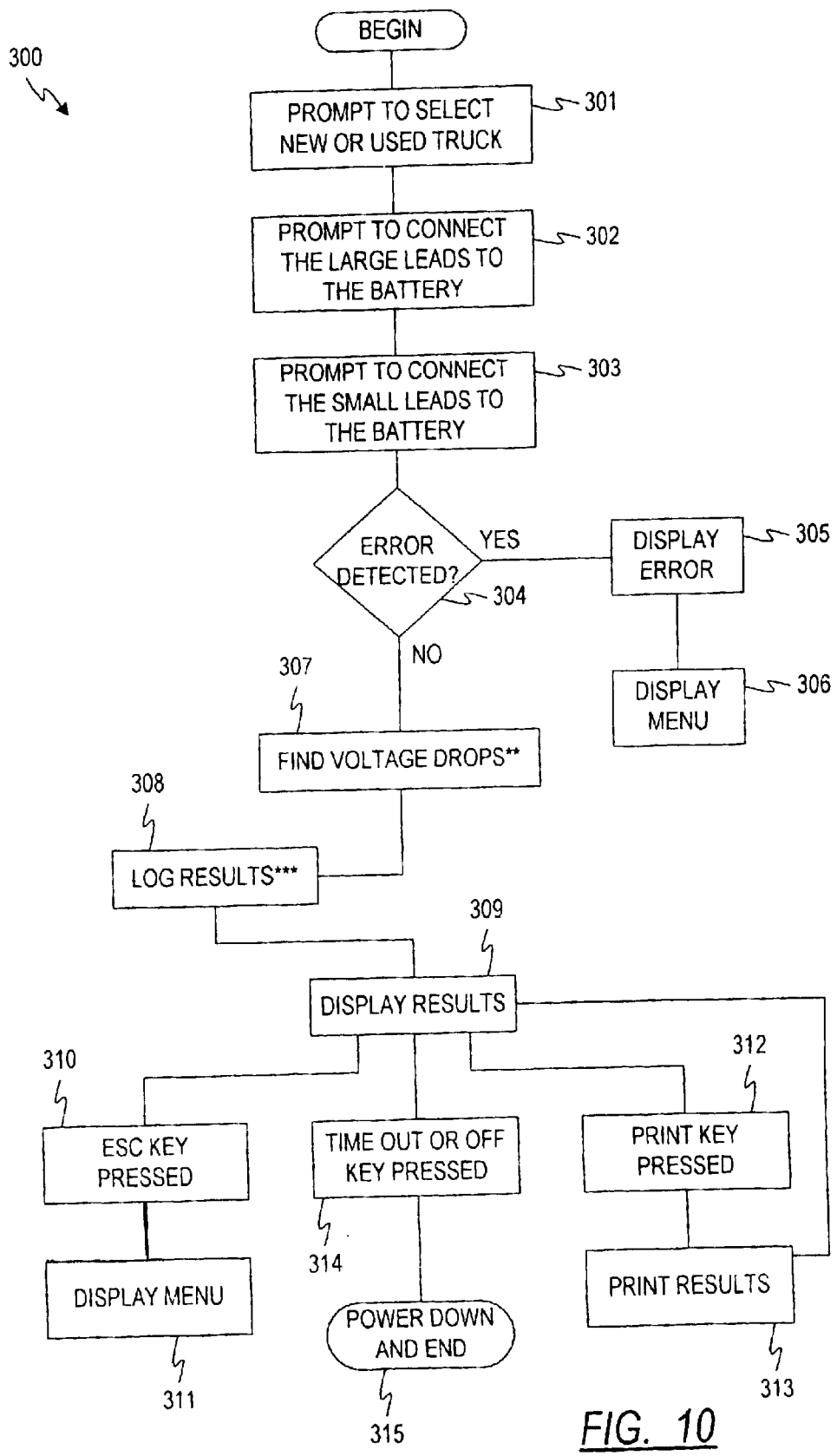
FIG. 10 is a flow chart of a starting-cables subroutine accessed by the program of FIG. 8.

If, at step 102 of the main program (illustrated in FIG. 8), the "starting main cables" option 111 is selected, the subroutine 300 of FIG. 10 is called. The first step 301 of this subroutine prompts a user to select whether a vehicle to be tested is "new" or "used". At step 302, the user is then prompted to connect the load leads 18a, 18b to a starter, and at step 303, the voltage leads 20a, 20b to the battery/system B under test. At step 304, the system checks to see if any errors are detected. Possible errors include, for example, reversal of the load leads 18a and 18b (indicated by a SYS NEG output voltage greater than 1 Volt), a determination that the load leads 18a and 18b are not connected (indicated by a SYS_POS output voltage less than 1 Volt), a bad connection on the load leads 18a and 18b (indicated by a BUS_VOLTS and SYS_POS output voltage difference exceeding 2 Volts), reversal of voltage leads 20a and 20b (indicated by a EXT_NEG output voltage value greater than 1 Volt), system noise (indicated by an AC_VOLTS output over 4 mV), a voltage drop with no load (indicated by a POS_DROP or NEG_DROP output voltage greater than 0.03 Volts), and a low system battery (indicated by an EXT_POS output voltage less than 12.25 Volts).

If an error is detected, at step 305, the testing unit 5 displays the detected error(s) and, at step 306, returns to the display menu of FIG. 8. If no errors are detected, at step 307, the voltage drops are determined in the same manner as step 205 of FIG. 9. From the SYS_POS, POS_DROP, and NEG_DROP output voltage values, the current-carrying capacity of the electrical system's wires and cables can handle, whether the cables have "passed" or "failed", and the percent drop in the positive and negative legs are computed by the following formula:

$$MaxCurrent = \frac{Current \times AllowableDrop}{TotalDrop}$$

$$\% \, PosDrop = \frac{POS\_DROP}{TotalDrop} \times 100$$

$$\% \, NegDrop = 100 - \% \, PosDrop$$

wherein:

$$Current = \frac{SYS\_POS}{Coil \, Resistance}$$

TotalDrop = POS_DROP + NEG_DROP

Allowable Drop = 0.5 Volts (for most vehicles)

Coil Resistance = 0.1 Ohms (Known resistance of coils)

If MaxCurrent exceeds 500 amps for a used truck or exceeds 667 amps for a new truck, the cables "Pass"; otherwise they "Fail". The results are logged and displayed in steps 308 and 309, respectively. The options available to the user after step 309, outlined in steps 310–315, are equivalent to steps 208–213 of FIG. 9.

Figure 11A:
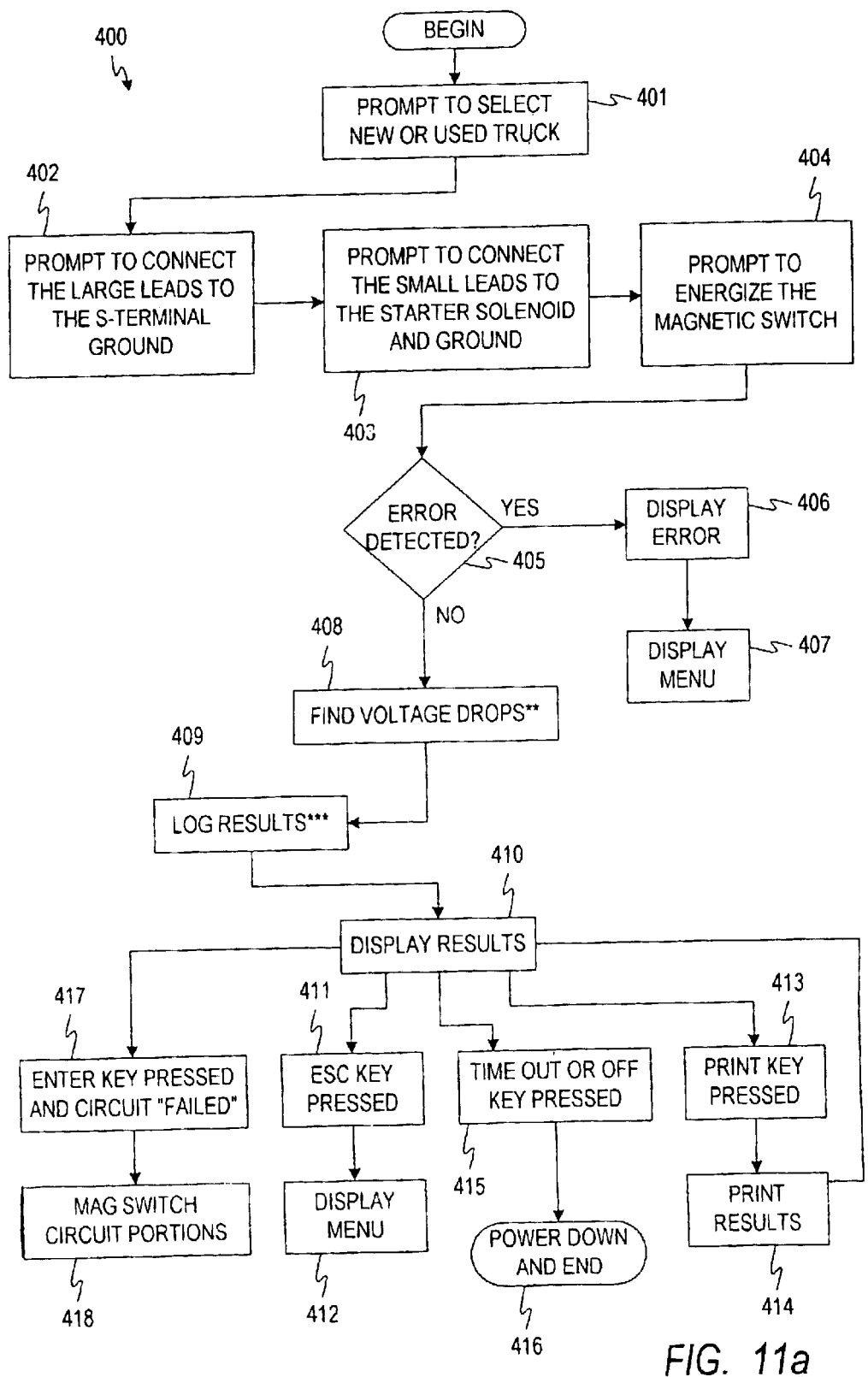
FIG. 11a is a flow chart of the magnetic-switch-circuit subroutine that is accessible by manual selection from a menu generated by the program of FIG. 8.

If the "magnetic switch circuit" option is selected at step 102 of the main program, a "magnetic switch circuit" subroutine 400 of FIG. 11a is called. At step 401, a user is first prompted to disconnect a magnetic switch circuit from an S-terminal on a starter solenoid. At step 402, the user is directed to connect a positive load lead 18a of the load leads 18a and 18b to the S-terminal and a negative load lead 18b to ground. Similarly, at step 403, the positive and negative voltage leads 20a and 20b are connected to the starter solenoid and ground, respectively. At step 404, the testing unit 5 then prompts the user to energize a magnetic switch of the vehicle. This may be accomplished by turning a key switch inside of the vehicle or wiring a remote starter into the key switch and starting the magnetic switch from a location outside of the vehicle. Step 405 checks for errors in the system; if an error is detected, it is displayed at step 406, and, at step 407, the testing unit 5 returns to the main menu of FIG. 8. If no error is detected, voltage drops are calculated in the following manner, beginning at step 408: The testing unit 5 first waits for the magnetic switch to be energized.

Energizing of the magnetic switch is detected by a SYS_POS output voltage exceeding 1 Volt. After monitoring for errors, one coil (LOAD1 34a, LOAD2 34b, or LOAD3 34c) in the load circuit 28 is turned on. The testing unit 5 experiences a delay of 0.75 seconds and then measures the SYS_POS and the POS_DROP output voltages. From the SYS_POS and the POS_DROP output voltage values, the voltage drop at 80 amps is calculated and a "Pass" or "Fail" status is assigned to the electrical system of the vehicle. The following formula computes the status of the magnetic switch circuit:

$$\text{Drop@80\_Amps} = \frac{\text{POS\_DROP} \times 80}{\text{Current}}$$

(If the Drop @80 Amps is less than 1.0 Volts, the circuit has "Passed"; otherwise it has "Failed".)
Wherein:

$$\text{Current} = \frac{\text{SYS\_POS}}{\text{Coil Resistance}}$$

Coil Resistance = 0.3 Ohms (Known resistance of one coil)

At step 409, the aforementioned results are logged. At step 410, the results are displayed and the testing unit 5 may proceed to one of four options. Three of these, outlined in steps 411–416, are equivalent to steps 208–213 of FIG. 9. The fourth option results if the circuit has received an indication that it has "Failed". The enter key is selected at step 417, and the testing unit 5 advances to step 418 which calls the "magnetic switch circuit portions" subroutine 450 of FIG. 11b.

Figure 11B:
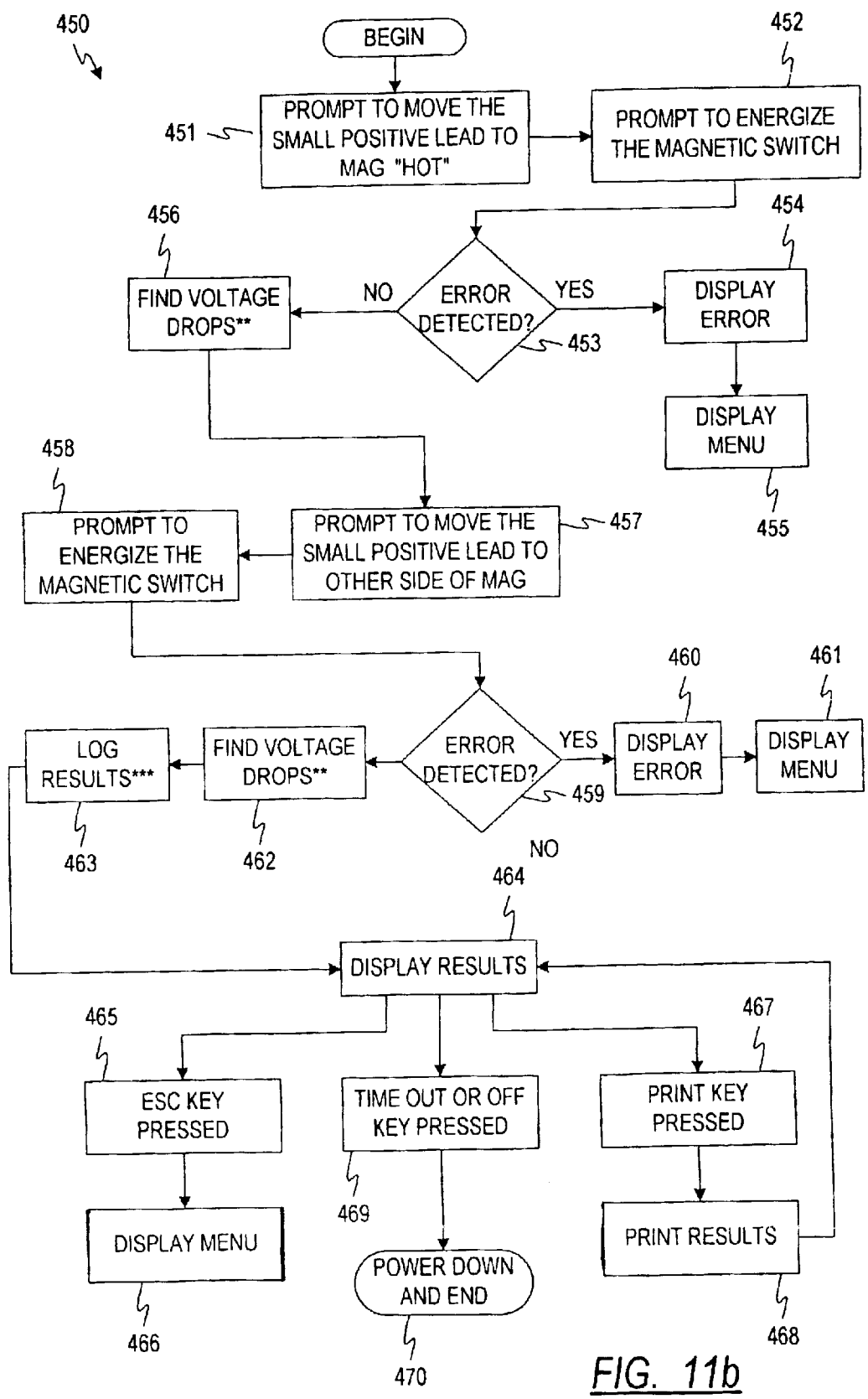

The subroutine 450 of FIG. 11b begins at step 451 by prompting the user to move the positive voltage lead 20a to the positive side of the magnetic switch (Mag "HOT"). The magnetic switch is energized at step 452 and, at step 453, the system checks for errors. Possible errors include a reversal of load leads 18a and 18b.(indicated by a SYS_NEG output voltage exceeding 1 Volt), a determination that the load leads 18a and 18b are not connected (indicated by a SYS_POS output voltage less than 1 Volt), a bad connection of the load leads 18a and 18b (indicated by a BUS_VOLTS and SYS_POS output voltage difference greater than 2 Volts), and a reversal of the voltage leads 20a and 20b (indicated by an EXT_NEG output voltage exceeding 1 Volt).

If an error is detected at step 453, the detected error is displayed at step 454, and the testing unit 5 returns to the main menu display at step 455. If no error is detected at step 453 voltage drops are found at step 456 in the following manner: The testing unit 5) waits for the SYS_POS output voltage to be greater than 1 Volt, which indicates that the magnetic switch circuit is energized. The testing unit 5 then checks for errors and turns on a single coil (LOAD1 34a, LOAD2 34b, or LOAD3 34c) in the load circuit 28. After a delay of approximately 0.75 seconds, the SYS_POS and the POS_DROP output voltage values are measured.

At step 457, the user is prompted to reconnect the positive voltage lead 20a at the negative side of the magnetic switch. The magnetic switch is again energized at step 458 and the testing unit 5 advances to step 459 to monitor for detection of errors. Potential errors include those described above in association with step 453. An affirmative response at step 459 advances the subroutine 450 to step 460, wherein the detected error is displayed. At step 461, the testing unit 5 then returns to the main menu display of FIG. 8.

A negative response at step 459 advances the subroutine 450 to step 462, wherein voltage drops are ascertained. Calculation of the SYS_POS and the POS_DROP occurs in the same manner as described with respect to step 456. From the SYS_POS and the POS_DROP output voltage values, the voltage drop at 80 amps and the status of the circuit ("Passed" or "Failed") are computed via the following formulae:

$$\text{DropLeg1@80\_Amps} = \frac{Drop1 \times 80}{Current}$$

$$\text{DropMagSwitch@80\_Amps} = \frac{Drop2 \times 80}{Current}$$

$$\text{DropLeg2@80\_Amps} = \frac{Drop1 \times 80}{Current}$$

If the drop at 80 AMPS in LEG 1 is less than 0.4 Volts, it "Passed" otherwise it "Failed".
If the drop at 80 AMPS in the Magnetic switch is less than 0.2 Volts, it "Passed", otherwise it "Failed".
If the drop at 80 AMPS in LEG 2 is less than 0.4 Volts, it "Passed", otherwise it "Failed".
Where:
Drop1=POS_DROP (from Mag Circuit test)—POS_DROP (#1)
Drop2=POS_DROP (#1)—POS_DROP (#2)
Drop3=POS_DROP (#2)
Current=SYS_POS/Coil Resistance
Coil Resistance=0.3 Ohms (Known resistance of one coil)
The results are logged and displayed at steps 463 and 464, respectively, and the user may then choose one of three options. First, at step 465, the escape key 16 may be pressed, which returns the user at step 466 to the display menu 102 of FIG. 8. Second, at step 467, the user may select the PRINT key, at which point the testing unit 5 prints the results and returns to step 464, via step 468, to display the results. Third, if no option is selected (step 469) within a time-out interval measured by the microprocessor 20 or if the on/off key 11 is pressed, the testing unit 5 powers down and the subroutine is exited at step 470.

Figure 12:
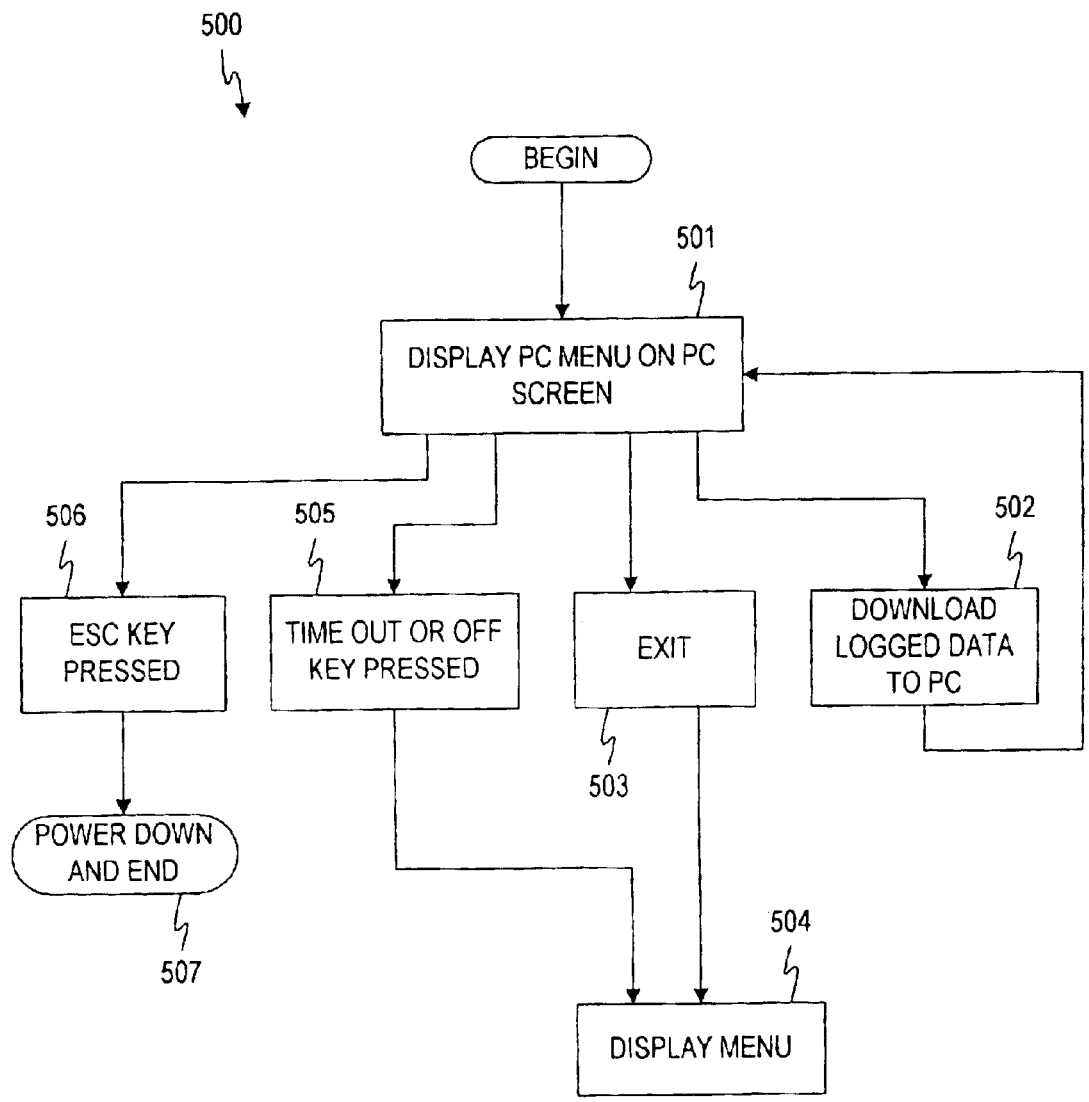
FIG. 12 is a flow chart of a communicate-with-PC subroutine that is accessible by manual selection from a menu generated by the program of FIG. 8.

If the "communicate with PC" option is selected at step 102 of the main program of FIG. 8, a subroutine 500 of FIG. 12 is called. At step 501 a message prompting the user to connect the testing unit 5 to a personal computer (PC), if the testing unit 5 is not already so connected is displayed. Connection to a PC is effected by inserting a stereo plug on an adapter cord into a jack 98 in the upper end of the testing unit 5 (shown in FIG. 1), and plugging a serial adapter on the other end of the cord into a serial port in the PC. When the testing unit 5 is connected to a PC, test results stored in the testing unit 5 can be downloaded to the PC at step 502 using a program in the PC such as "Windows 98 Hyper Terminal."

If, at either steps 503 or 505, the exit key of the PC or the escape key 16 of the testing unit 5, respectively, is pressed, the main menu is displayed at step 504. At step 507, the testing unit 5 turns off if the on/off key 11 is pressed or if after a two-minute timeout period the user does nothing (step 506).

Figure 13:
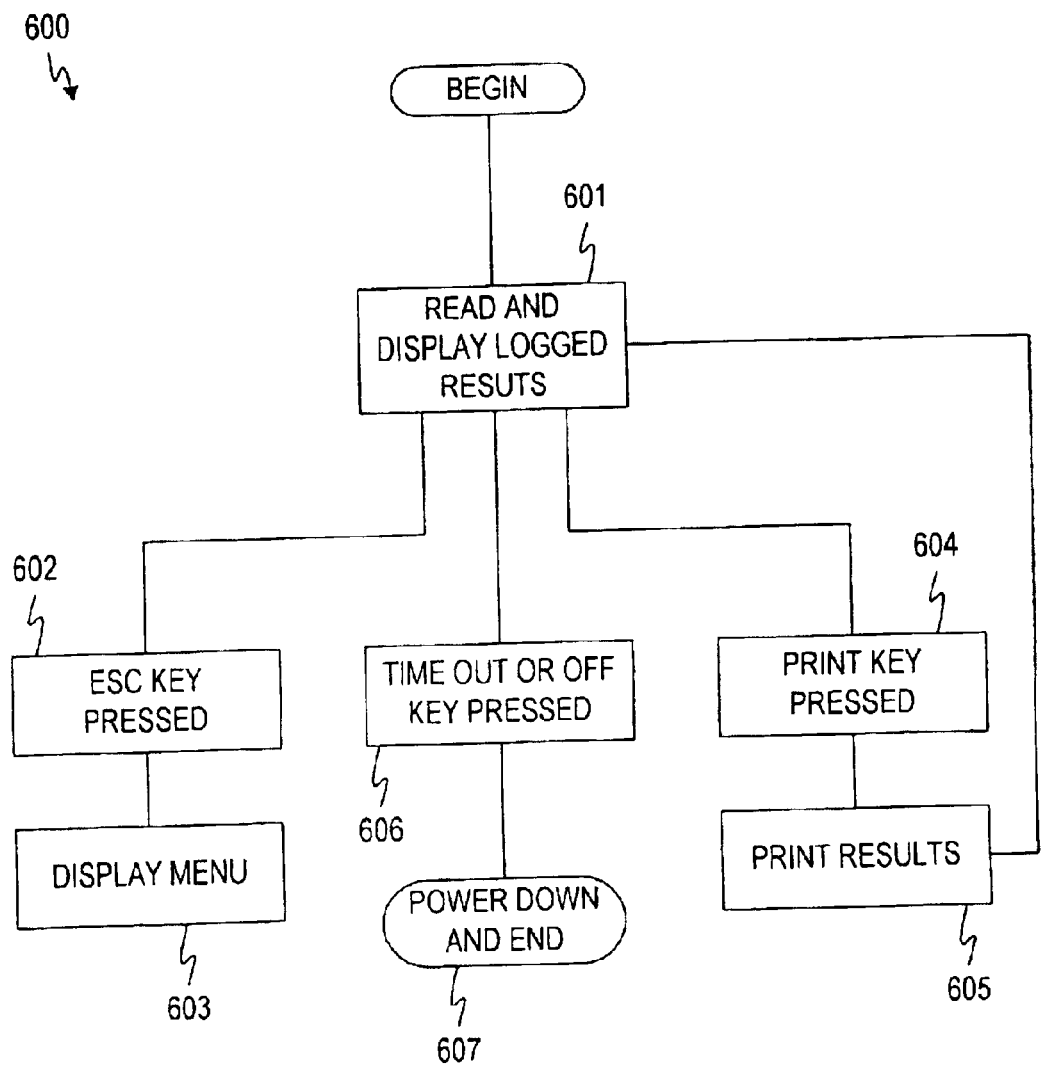
FIG. 13 is a flow chart of a review/print subroutine that is accessible by manual selection from a menu generated by the program of FIG. 8.

If the "review/print" option is selected at step 114 of FIG. 8, a subroutine 600 of FIG. 13 is called. At step 601, logged results of the preceding test are read and displayed. The up and down keys 13 and 14 of the four manual keys 13–16 can then be pressed by the user to increment or decrement to a desired test. The operation therefrom is identical to that described above for the "charging cables" subroutine, in other words, at step 603 the testing unit 5 displays the main menu if, at step 602, the escape key 16 is pressed; the testing unit 5 prints, at step 605, the displayed results if, at step 604, the print key 12 is pressed; the testing unit 5 turns off at step 607 if, at step 606 the on/off key 11 is pressed or, if after a two-minute timeout period, the user does nothing. Coupling to a printer is effected by an infrared coupling diode 99 mounted in the upper end of the testing unit (see FIGS. 1 and 4).

Figure 14:
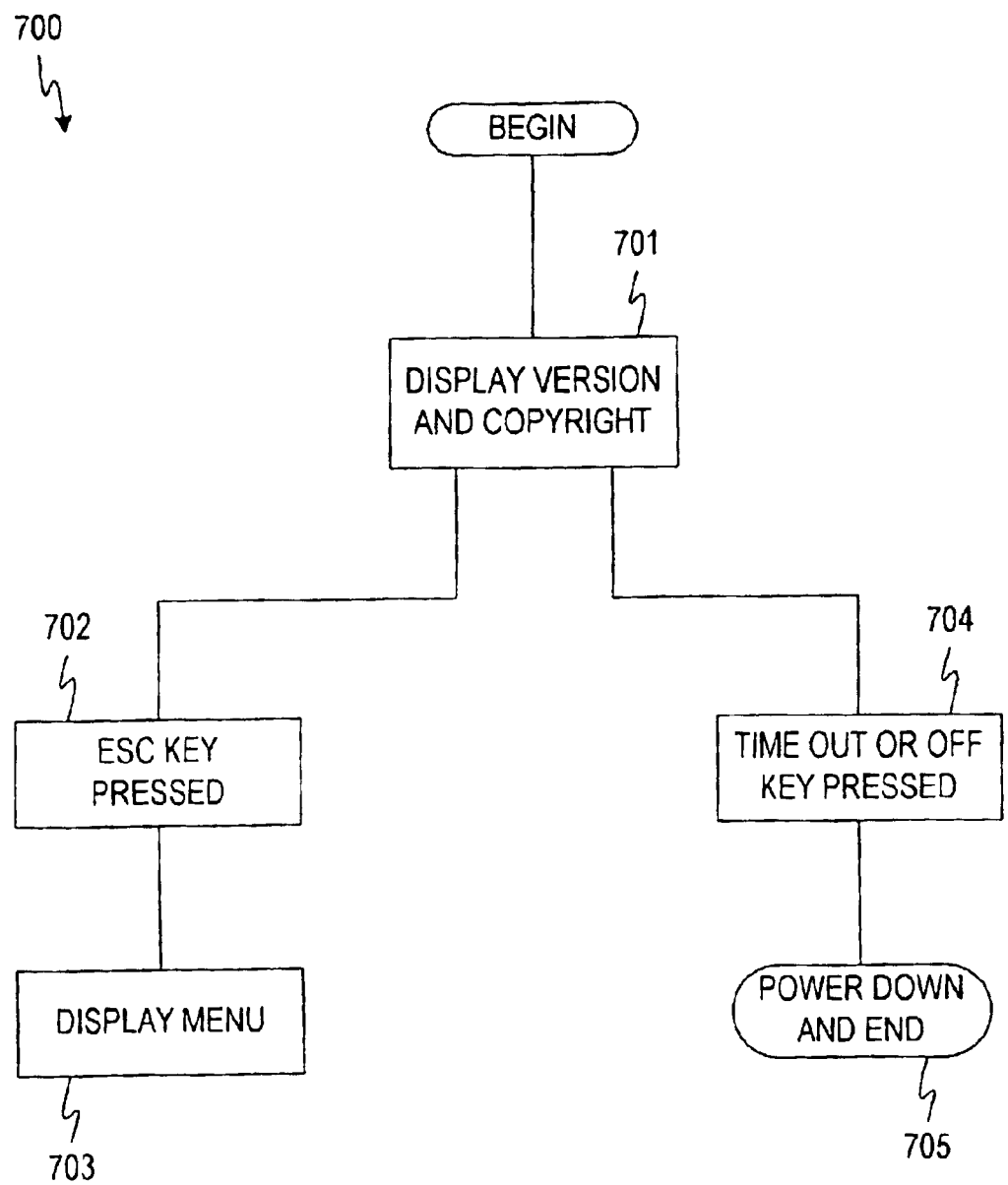
FIG. 14 is a flow chart of a show-version-and-copyright subroutine that is accessible by manual selection from a menu generated by the program of FIG. 8.
Figure 15:
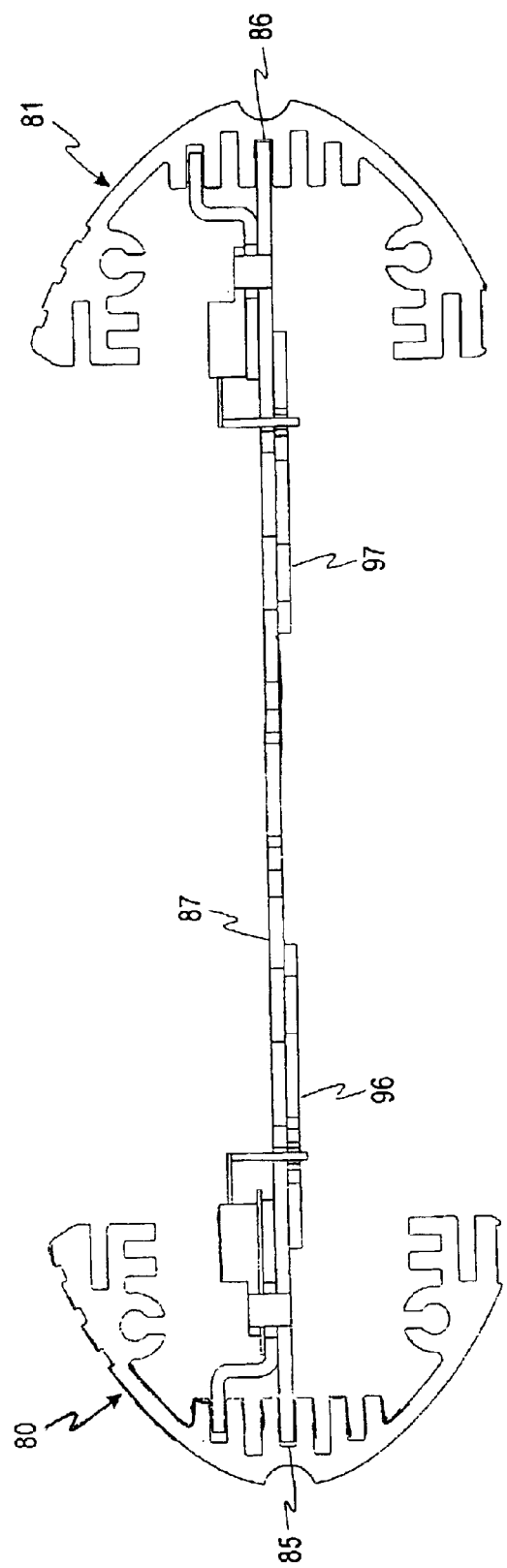
FIG. 15 is a sectional view taken transversely through a lower half of the testing unit shown in FIG. 1.

If the "show version and copyright" option 115 is selected from the options menu displayed at step 102 of the main program of FIG. 8, the subroutine 700 of FIG. 14 is called. At step 701, the version of the testing unit 5 and the copyright data are displayed. If, at step 702, the escape key 16 is pressed, the testing unit 5 returns to the main menu display at step 703. Additionally, at step 705, the testing unit 5 powers down if the on/off key 11 is pressed or if, at step 704, after a timeout period, the user does nothing.

Figure 19:
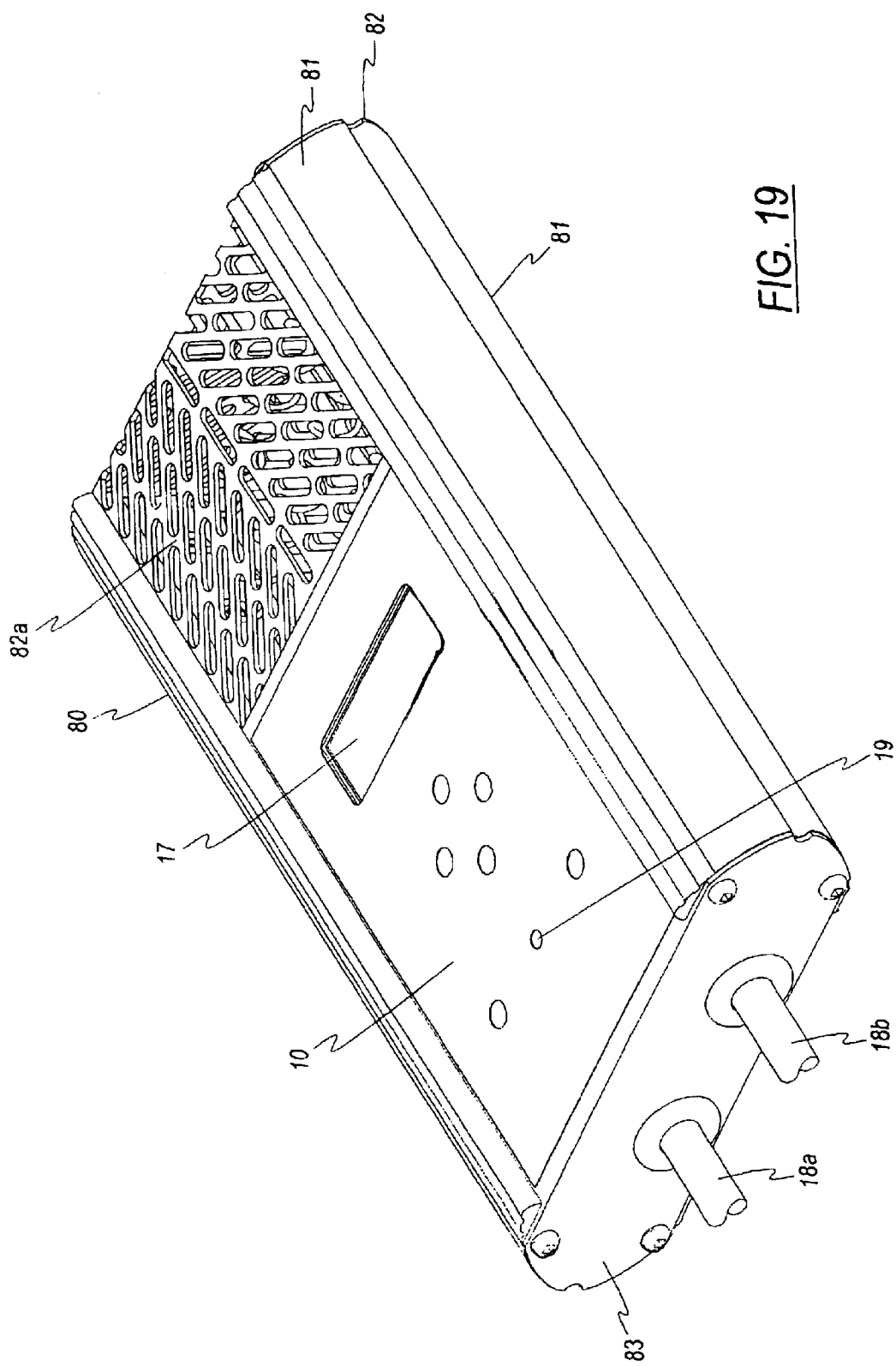
FIG. 19 is a perspective front view of an analyzer shown in FIG. 1 without keys, taken from a lower end of the testing unit of FIG. 1.

Structurally, the testing unit 5 of FIG. 1 includes a strong, durable housing formed by a pair of extruded aluminum side members 80 and 81 (see FIGS. 1, 15, 17, and 19) joined at opposite ends by a pair of end plates 82 and 83 attached to the side members 80, 81 by multiple screws 84 (see FIGS. 1 and 19). Interior surfaces of the two side members 80, 81 form a first set of elongated slots 85 and 86 (FIG. 15) for receiving and supporting a printed circuit board 87 that carries all the electronic circuitry except for the three large resistors R21–R23 of the load circuit 28 (of FIG. 6) that form the high-current load for the battery under test. Because of the high current levels, these resistors R21–R23 dissipate a substantial amount of heat, and thus they are mounted in a ventilated end portion of the housing away from the printed circuit board 87. The ends of the three resistors R21–R23 are connected to a pair of insulating mounting plates 88 and 89 that fit into mating slots 88a, 88b and 89a, 89b formed in the interior surfaces of the respective side members 80, 81 (see FIG. 17). A third plate 90 extends across the upper end of the printed circuit board 87 and overlaps the lower ends of the insulating mounting plates 88 and 89. The insulating mounting plates 88, 89 and the third plate 90 combine to form an effective heat shield from the heat dissipated in the resistors R21–R23 during high-current load testing of the battery/system B under test.

The bottom front panel 10 (FIGS. 1 and 19) fits into a second and a third set of elongated slots 91, 92 and 94, 95 (see FIG. 17) formed in the interior surfaces of the two side members 80 and 81. The bottom front panel 10 extends from the lower ends of the side members 80, 81 to at least the upper end of the printed circuit board 87. Similarly, vented top panels 82a and 82b fit into the other ends of the second and third set of elongated slots 91, 92 and 94, 95 formed in the interior surfaces of the side members 80 and 81 and extends to meet the bottom front panel 10. An entire upper portion of the testing unit 5, including the end plate 82 and the top panels 82a and 82b, is apertured (see FIGS. 1 and 18) to facilitate the dissipation of heat from the three resistors R21–R23.

Figure 16:
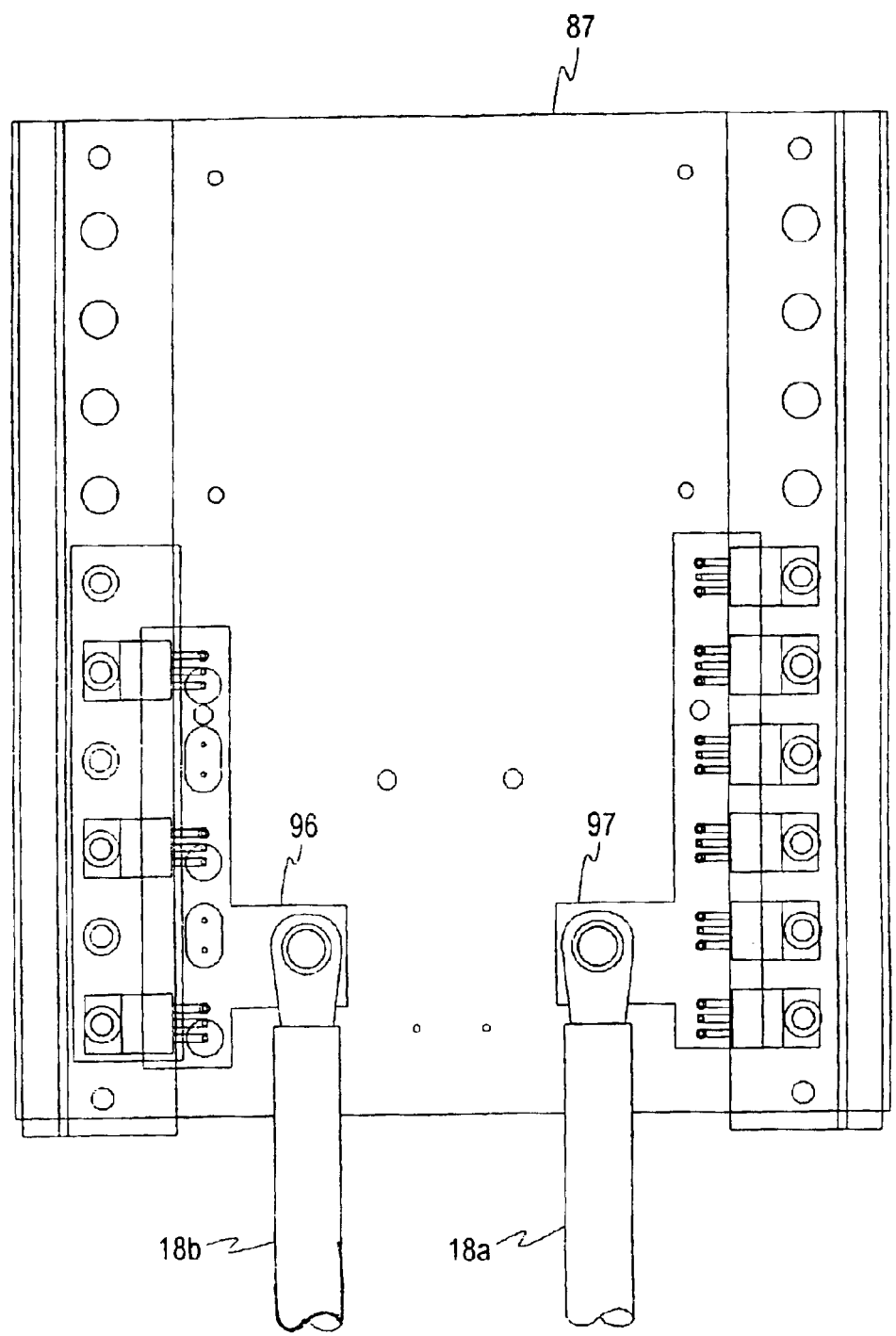
FIG. 16 is a bottom plan view of a printed circuit board of FIG. 15.
Figure 17:
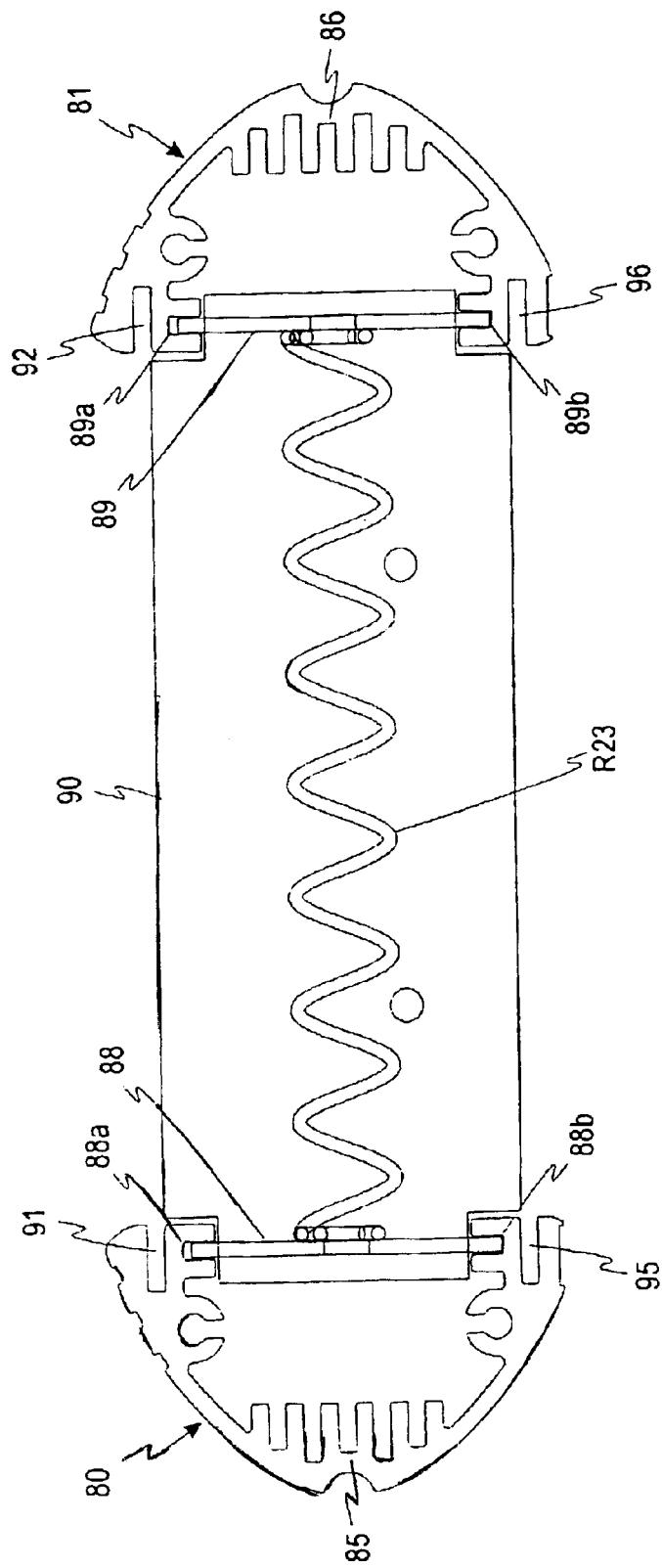
FIG. 17 is a sectional view taken transversely through an upper half of the testing unit of FIG. 1.
Figure 18:
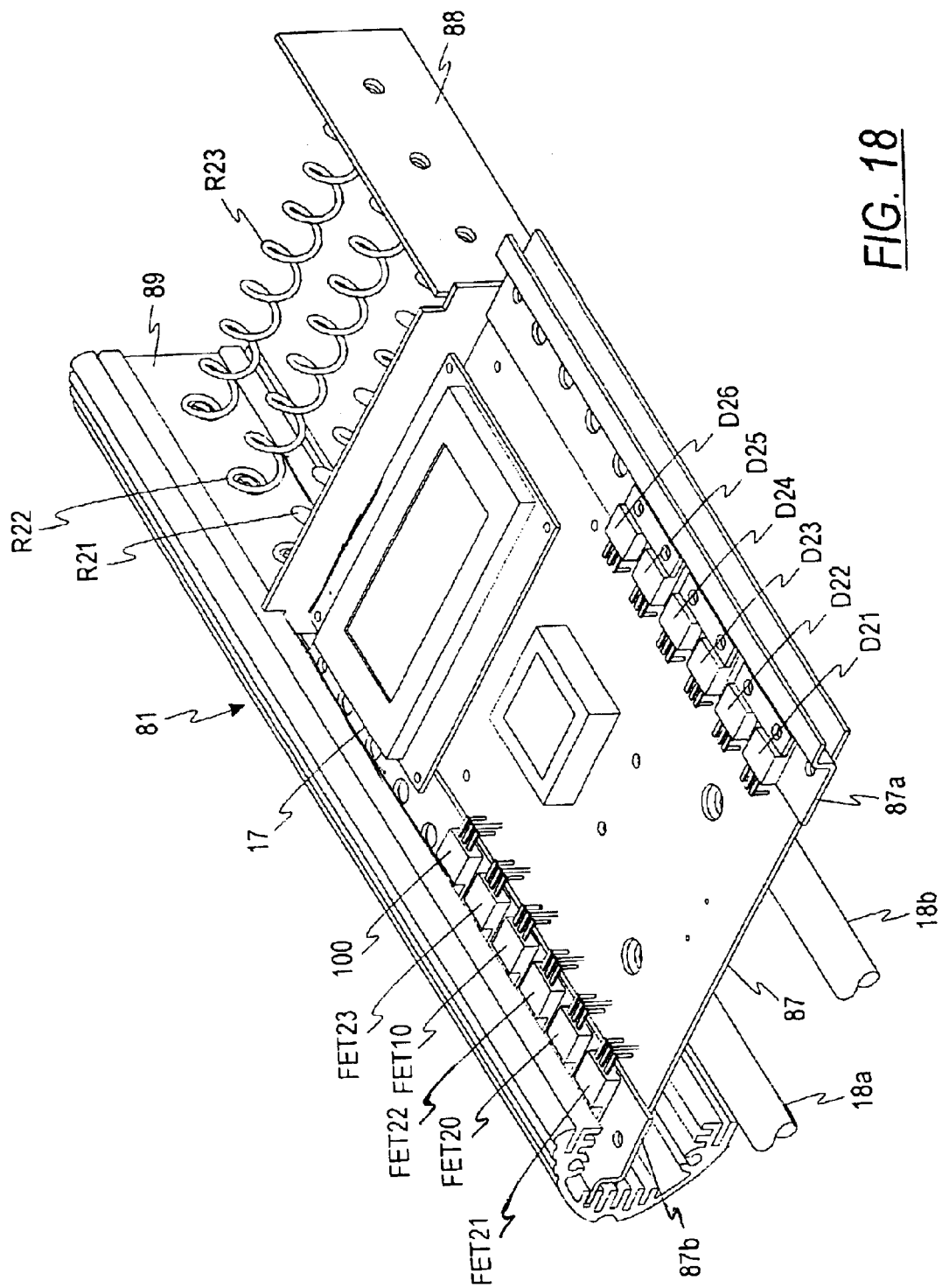
FIG. 18 is a perspective front view of an internal structure of the testing unit of FIG. 1, showing a top surface of a printed circuit board and a side wall of a housing.

Referring now to FIGS. 16 and 18, there is shown the printed circuit board 87 carrying two rows of TO-220 packaged devices, including switching transistors FET10, FET20, FET21–23, a voltage regulator 100, and diodes D21–D26, mounted along opposite edges of the printed circuit board 87. These TO-220 packaged devices are mounted on a pair of aluminum strips 87a and 87b that overlap the edge portions of the printed circuit board 87 and extend into mating slots in the side members 80 and 81 (see FIG. 18) to assist in dissipating heat from the components, especially when the load circuit 28 (of FIG. 2) is utilized.

The load leads 18a and 18b that connect the testing unit 5 to the battery/system B under test are connected to copper plates 96 and 97 near the lower end of the printed circuit board 87, as can be seen in FIG. 16. These copper plates 96 and 97 mount to the back of the printed circuit board 87 and carry the high current that flows through the diodes D21–26, the loads R21–23 and the transistors FET21–23 to the load leads 18a and 18b. These copper plates 96 and 97 permit the use of small components such as the TO-220, packaged devices, despite the high current levels.

While the present invention has been described with reference to one or more particular embodiments, those skilled in the art will recognize that many changes may be made thereto without departing from the spirit and scope of the present invention as is set forth in the following claims.

What is claimed is:

1. A method of measuring voltage drops in an electrical system, the method comprising:
    connecting a plurality of load leads to a charging component of the electrical system, said plurality of load leads including a positive load lead and a negative load lead, each of said plurality of load leads being coupled to a testing device;
    connecting a plurality of voltage leads to a battery of the electrical system, said plurality of voltage leads including a positive voltage lead and a negative voltage lead, said plurality of voltage leads being coupled to said testing device;
    applying a load of known resistance to the electrical system by the testing device;
    measuring a voltage at the load;
    measuring a first voltage drop between the positive load lead and the positive voltage lead; and
    measuring a second voltage drop between the negative load lead and the negative voltage lead, wherein measurements of the first and second voltage drops are based, at least in part, on the voltage at the load.

2. The method of claim 1, further comprising calculating a current drawn by the testing device using the measured voltage at the load.

3. The method of claim 2, further comprising calculating a first resistance and a second resistance associated with the plurality of load leads and the plurality of voltage leads, respectively, based on the calculated current and the first and second voltage drops.

4. The method of claim 3, further comprising:
    determining a current that would produce a maximum allowable voltage drop in the electrical system, based on the first and second resistances and the first and second voltage drops, respectively.

5. The method of claim 1, wherein the charging component comprises an alternator.

6. The method of claim 1, further comprising determining a condition of the charging component based on the first and second voltage drops.

7. The method of claim 1, further comprising displaying, on the testing device, values associated with the first and second voltage drops.

8. The method of claim 1, wherein the steps are performed in the order listed.

9. A method of measuring voltage drops in positive and negative legs of starting components of an electrical system, the method comprising:

connecting a plurality of load leads to a starting component of the electrical system, the plurality of load leads including a positive load lead and a negative load lead, the plurality of load leads being coupled to a testing device;

connecting a plurality of voltage leads to a battery of the electrical system, the plurality of voltage leads including a positive voltage lead and a negative voltage lead, the plurality of voltage leads coupled to the testing device;

applying a load of known resistance to the electrical system by the testing device;

measuring a voltage at the load;

measuring a first voltage drop between the positive load lead and the positive voltage lead; and measuring a second voltage drop between the negative load lead and the negative voltage lead, wherein measurements of said first and second voltage drops are based, at least in part, on the voltage at the load.

10. The method of claim 9, further comprising calculating a current drawn by the testing device using the measured voltage at the load.

11. The method of claim 10, further comprising calculating a first resistance and a second resistance associated with the plurality of load leads and the plurality of voltage leads, respectively, based on the calculated current and the first and second voltage drops, respectively.

12. The method of claim 11, further comprising the step of determining a system current that would produce a maximum allowable voltage drop in the electrical system, based on the first and second resistances and the first and second voltage drops.

13. The method of claim 9, wherein the starting component comprises a starter.

14. The method of claim 9, further comprising the step of determining a condition of the starting component based on the first and second voltage drops.

15. The method of claim 14, further comprising the step of indicating the condition of the starting component on the testing device.

16. The method of claim 9, wherein the steps are performed in the order listed.

17. An apparatus for testing and measuring voltage drops in a positive and a negative leg of an electrical system, the apparatus comprising:

a plurality of load leads adapted to provide an electrical connection to a charging component of the electrical system, the plurality of load leads including a positive load lead and a negative load lead;

a plurality of voltage leads adapted to provide an electrical connection to a battery of the electrical system, the plurality of voltage leads including a positive voltage lead and a negative voltage lead;

means for applying a load of known resistance to the electrical system;

means for measuring a voltage at the load; and means for measuring a first voltage drop between the positive load lead and the positive voltage lead and a second voltage drop between the negative load lead and the negative voltage lead, wherein measurements of said first and second voltage drops are based, at least in part, on the voltage at the load.

18. The apparatus of claim 17, further comprising means for calculating a current drawn by the apparatus using the measured voltage at the load.

19. The apparatus of claim 17, further comprising means for calculating a first resistance and a second resistance associated with the plurality of load leads and the plurality of voltage leads, respectively, based on the calculated current and the first and second voltage drops.

20. The apparatus of claim 19, further comprising means for determining a current that would produce a maximum allowable voltage drop in the electrical system, based on the first and second resistances and the first and second voltage drops.

21. The apparatus of claim 17, wherein the charging component comprises an alternator.

22. The apparatus of claim 17, further comprising means for determining a condition of the charging component based on the first and second voltage drops.

23. The apparatus of claim 17, further comprising a display for displaying values associated with the first and second voltage drops.

24. An apparatus for measuring voltage drops in positive and negative legs of an electrical system, the apparatus comprising:

a plurality of load leads adapted to provide an electrical connection to a starting component of the electrical system, the plurality of load leads including a positive load lead and a negative load lead;

a plurality of voltage leads adapted to provide an electrical connection to a battery of the electrical system, the plurality of voltage leads including a positive voltage lead and a negative voltage lead;

means for applying a load of known resistance to the electrical system;

means for measuring a voltage at the load; and means for measuring a first voltage drop between the positive load lead and the positive voltage lead and a second voltage drop between the negative load lead and the negative voltage lead, wherein measurements of said first and second voltage drops are based, at least in part, on the voltage at the load.

25. The apparatus of claim 24, further comprising means for calculating a current drawn by the testing device using the measured voltage at the load.

26. The apparatus of claim 25, further comprising means for calculating a first resistance and a second resistance associated with the plurality of load leads and the plurality of voltage leads, respectively, based on the calculated current and the first and second voltage drops.

27. The apparatus of claim 26, further comprising means for determining a system current that would produce a maximum allowable voltage drop in the electrical system, based on the first and second resistances and the first and second voltage drops.

28. The apparatus of claim 24, wherein the starting component comprises a starter.

29. The apparatus of claim 24, further comprising means for determining a condition of the starting component based on the first and second voltage drops.

30. The apparatus of claim 29, further comprising a display for displaying the condition of the starting component.

* * * * *